(12) United States Patent
Kobayashi

(10) Patent No.: US 7,898,899 B2
(45) Date of Patent: Mar. 1, 2011

(54) SEMICONDUCTOR INTEGRATED CIRCUIT AND SYSTEM

(75) Inventor: Hiroyuki Kobayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 251 days.

(21) Appl. No.: 12/343,061

(22) Filed: Dec. 23, 2008

(65) Prior Publication Data
US 2009/0161469 A1    Jun. 25, 2009

(30) Foreign Application Priority Data
Dec. 25, 2007    (JP) .................................. 2007-332342

(51) Int. Cl.
*G11C 8/00*    (2006.01)
(52) U.S. Cl. ................... 365/230.08; 365/189.05
(58) Field of Classification Search .............. 365/230.08, 365/189.05, 222
See application file for complete search history.

(56) References Cited

U.S. PATENT DOCUMENTS

| | | | |
|---|---|---|---|
| 6,166,990 A * | 12/2000 | Ooishi et al. .............. | 365/233.11 |
| 6,897,695 B2 | 5/2005 | Arai | |
| 6,925,023 B2 * | 8/2005 | Mizugaki et al. ............. | 365/222 |
| 2007/0101177 A1 * | 5/2007 | Kuroki .......................... | 713/500 |

FOREIGN PATENT DOCUMENTS

JP    2004-187219 A    7/2004

* cited by examiner

*Primary Examiner* — Anh Phung
(74) *Attorney, Agent, or Firm* — Arent Fox LLP

(57) ABSTRACT

The semiconductor integrated circuit comprises: a first buffer circuit that outputs a first output signal to an output terminal on receipt of a first input signal; a second buffer circuit that includes a circuit having a similar configuration to the first buffer circuit, that outputs a second output signal on receipt of the first input signal, and that outputs the second output signal based on a check signal; a third buffer circuit that outputs a third output signal based on the check signal; a determination circuit that receives the second output signal and the third output signal and activates a detection signal, in response to the detection that the second output signal is behind the third output signal; and a fourth buffer circuit that operates during the activation of the detection signal and outputs the third output signal to the output terminal, on receipt of the first input signal.

20 Claims, 32 Drawing Sheets

SEMICONDUCTOR INTEGRATED CIRCUIT AND SYSTEM

CROSS-REFERENCE TO RELATED APPLICATIONS

This application claims the benefit of priority from Japanese Patent Application No. 2007-332342 filed on Dec. 25, 2007, the entire contents of which are incorporated herein by reference.

BACKGROUND OF THE INVENTION

1. Field of the Invention

Aspects of this application relate to a semiconductor integrated circuit and a system on which a semiconductor integrated circuit is mounted.

2. Description of the Related Arts

A transistor or the like mounted on a semiconductor integrated circuit tends to be microfabricated, and a power supply voltage supplied to the semiconductor integrated circuit tends to decrease. However, in a system including a semiconductor integrated circuit mounted thereon, an input buffer receiving a signal or an output buffer outputting a signal needs high power supply voltage.

A buffer circuit receiving an external signal is disclosed in Japanese Laid-open Patent Publication No. 2004-187219.

SUMMARY

Aspects of a semiconductor integrated circuit may include, among other things: a first buffer circuit that outputs a first output signal to an output terminal on receipt of a first input signal; a second buffer circuit that includes a circuit having a similar configuration to the first buffer circuit, that outputs a second output signal on receipt of the first input signal, and that outputs the second output signal based on a check signal; a third buffer circuit that outputs a third output signal based on the check signal; a determination circuit that receives the second output signal and the third output signal and that activates a detection signal in response to the detection that the second output signal is behind the third output signal; and a fourth buffer circuit that operates during the activation of the detection signal and that outputs the third output signal to the output terminal on receipt of the first input signal.

Additional advantages and novel features of the invention will be set forth in part in the description that follows, and in part will become more apparent to those skilled in the art upon examination of the following or upon learning by practice of the invention.

DESCRIPTION OF PREFERRED EMBODIMENTS

In the figures, signal lines illustrated in bold indicate that a plurality of signal lines are provided. A part of a block to which each of the bold lines is coupled includes plural circuits. Signal lines are labeled with reference symbols representing names of signals transmitted through the signal lines. A double-square symbol represents an external terminal such as a pad on a semiconductor chip or a lead of a package containing the semiconductor chip therein. Terminals and signals supplied through the terminals, respectively, are denoted by like reference symbols. A signal having a reference symbol prefixed with a symbol "/" or having a reference symbol suffixed with a letter "X/" indicates a negative logic. A signal having a reference symbol suffixed with a letter "Z" indicates a positive logic.

Figure 1:
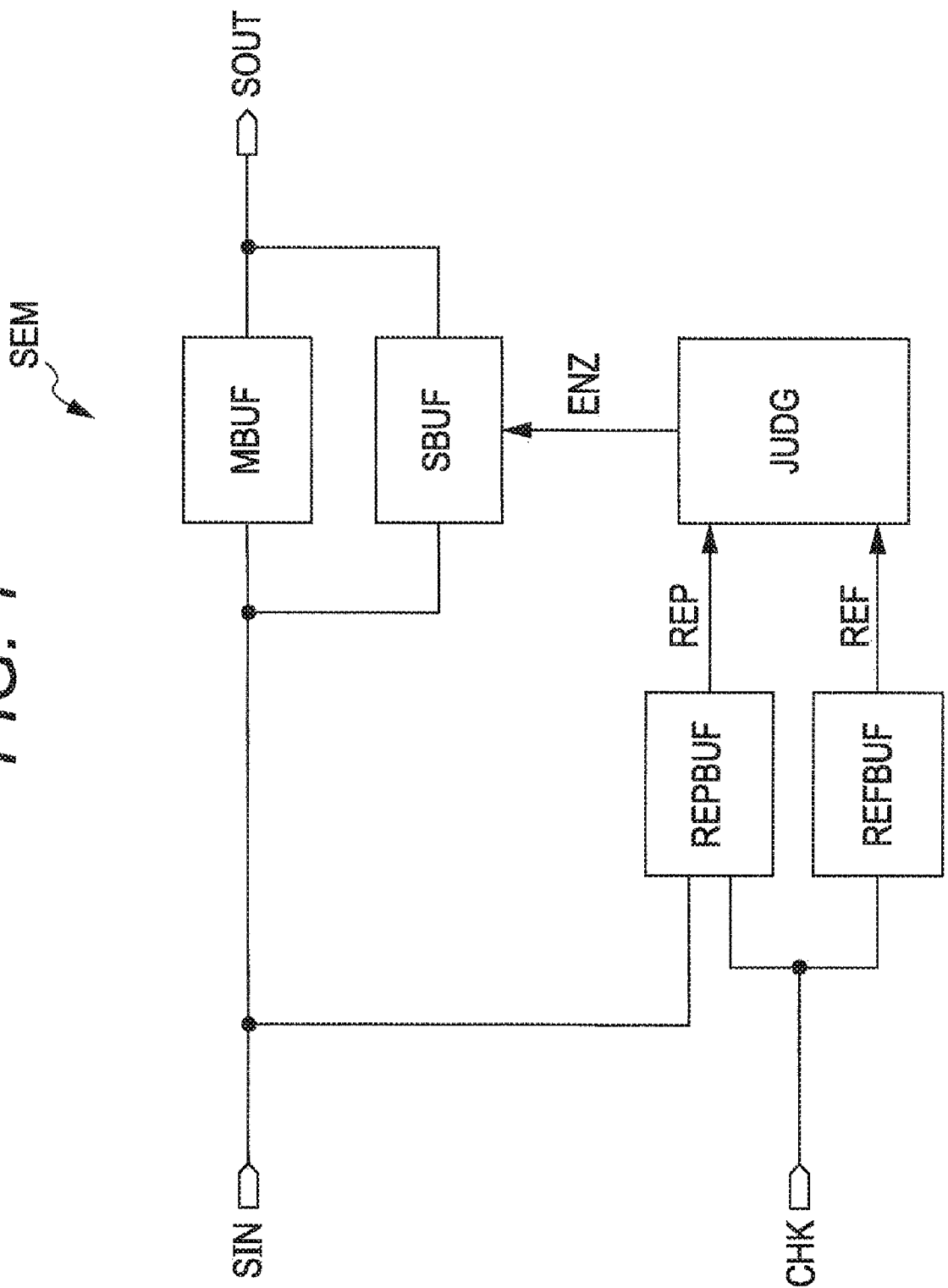
FIG. 1 shows aspects of a first embodiment.

FIG. 1 shows a first embodiment. A semiconductor integrated circuit SEM includes a main buffer circuit MBUF, a sub-buffer circuit SBUF, a replica buffer circuit REPBUF, a reference buffer circuit REFBUF, and a determination circuit JUDG. For example, the semiconductor integrated circuit SEM is mounted on a system SYS shown in FIG. 8 as a semiconductor memory MEM. The main buffer circuit MBUF is, for example, an input buffer or an output buffer.

The main buffer circuit MBUF receives an input signal SIN and outputs an output signal SOUT. The input signal SIN is a real input signal output from an unillustrated internal circuit. The output signal SOUT is a real output signal supplied to the unillustrated internal circuit. The sub-buffer circuit SBUF operates during the activation of an enable signal ENZ. The sub-buffer circuit SBUF receives the input signal SIN and outputs a sub-real output signal to an output terminal SOUT of the main buffer circuit MBUF.

The replica buffer circuit REPBUF has the same configuration as that of the main buffer circuit MBUF, for example. The replica buffer circuit REPBUF receives the input signal SIN (replica input signal), which is supplied to the main buffer circuit MBUF, and outputs a replica output signal REP. The electrical characteristic of the replica buffer circuit REPBUF deteriorates to a level equal to the electrical characteristic of the main buffer circuit MBUF when it receives the input signal SIN that is common to the main buffer circuit MBUF. The replica buffer circuit REPBUF receives a check signal CHK, which is supplied at a predetermined frequency, and outputs a replica output signal REP. The reference buffer circuit REPBUF receives the check signal CHK and outputs a reference output signal REF. For example, the check signal CHK is supplied to the replica buffer circuit REPBUF and the reference buffer circuit REFBUF while the input signal SIN is not supplied. The determination circuit JUDG receives the replica output signal REP and the reference output signal REF. When the determination circuit JUDG detects that the replica output signal is later than the reference output signal REF, the determination circuit JUDG activates the enable signal ENZ, and retains the activated state while the power supply voltage is supplied. For example, the determination circuit JUDG compares the phases of the transition edges of the replica output signal REP and the reference output signal REF so as to detect a delay of the replica output signal REP, and outputs the enable signal ENZ.

The relative delay of the replica output signal REP indicates not only the deterioration of the replica buffer circuit REPBUF but also the deterioration of the main buffer circuit MBUF. The characteristic of the replica buffer circuit REPBUF, which is deteriorated with the main buffer circuit MBUF, is checked at a predetermined frequency on receipt of the common input signal SIN. According to this check, the deterioration of the main buffer circuit MBUF is determined without stopping the operation of the main buffer circuit MBUF. When the deterioration is determined, the deterioration of the characteristic of the main buffer circuit MBUF is supplemented by the sub-buffer circuit SBUF. The electrical characteristic of the deteriorated main buffer circuit MBUF is recovered without stopping the operation of the main buffer circuit MBUF. The operating life of the system SYS, on which the semiconductor integrated circuit SEM is mounted, is prolonged.

Figure 2:
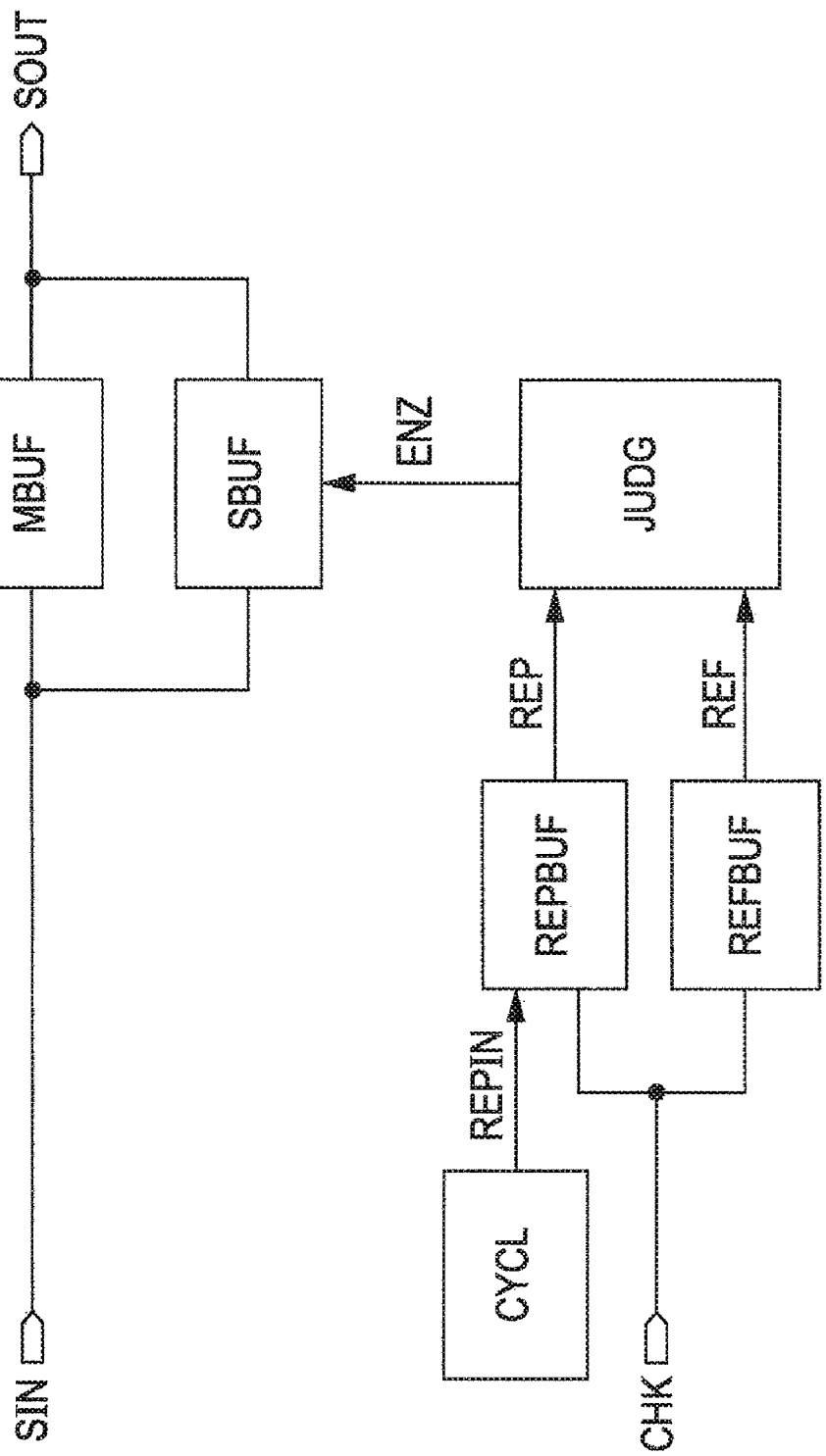
FIG. 2 shows aspects of a second embodiment.

FIG. 2 shows a second embodiment. The same elements as those in the first embodiment are denoted by the same numerals, and the explanation thereof are omitted. A semiconductor integrated circuit SEM in the second embodiment is obtained by adding a cycle circuit CYCL to the configuration of the first embodiment. The cycle circuit CYCL generates a replica input signal REPIN in response to an external input, or automatically generates the replica input signal REPIN. The frequency of generating the replica input signal REPIN is higher than the frequency of supplying the input signal SIN. Different from the first embodiment, the replica buffer circuit REPBUF receives not the input signal SIN but the replica input signal REPIN. The remaining configuration of the second embodiment is the same as the first embodiment. For example, the semiconductor integrated circuit SEM may be mounted on the system SYS shown in FIG. 8 as the semiconductor memory MEM.

In the second embodiment, the replica input signal REPIN, which is more frequently generated than the input signal SIN, is supplied to the replica buffer circuit REBBUF. Therefore, when the main buffer circuit MBUF deteriorates, the enable signal ENZ is accurately generated, whereby driving capability, which becomes insufficient due to the deterioration, is supplemented by the sub-buffer circuit SBUF. The second embodiment prolongs the operating life of the system SYS on which the semiconductor integrated circuit SEM is mounted.

The worst conditions for the frequency of supplying the replica input signal REPIN to the replica buffer circuit REPBUF are set. When the semiconductor integrated circuit SEM has plural main buffer circuits MBUF, a common enable signal ENZ is activated according to the deterioration of any one of the plural main buffer circuits MBUF. The replica buffer circuit REPBUF, the reference buffer circuit REPBUF, and the determination circuit JUDG are provided so as to be common to plural pairs of the main buffer circuit MBUF and the sub-buffer circuit SBUF. Therefore, the chip size of the semiconductor integrated circuit SEM in the second embodiment is reduced.

Figure 3:
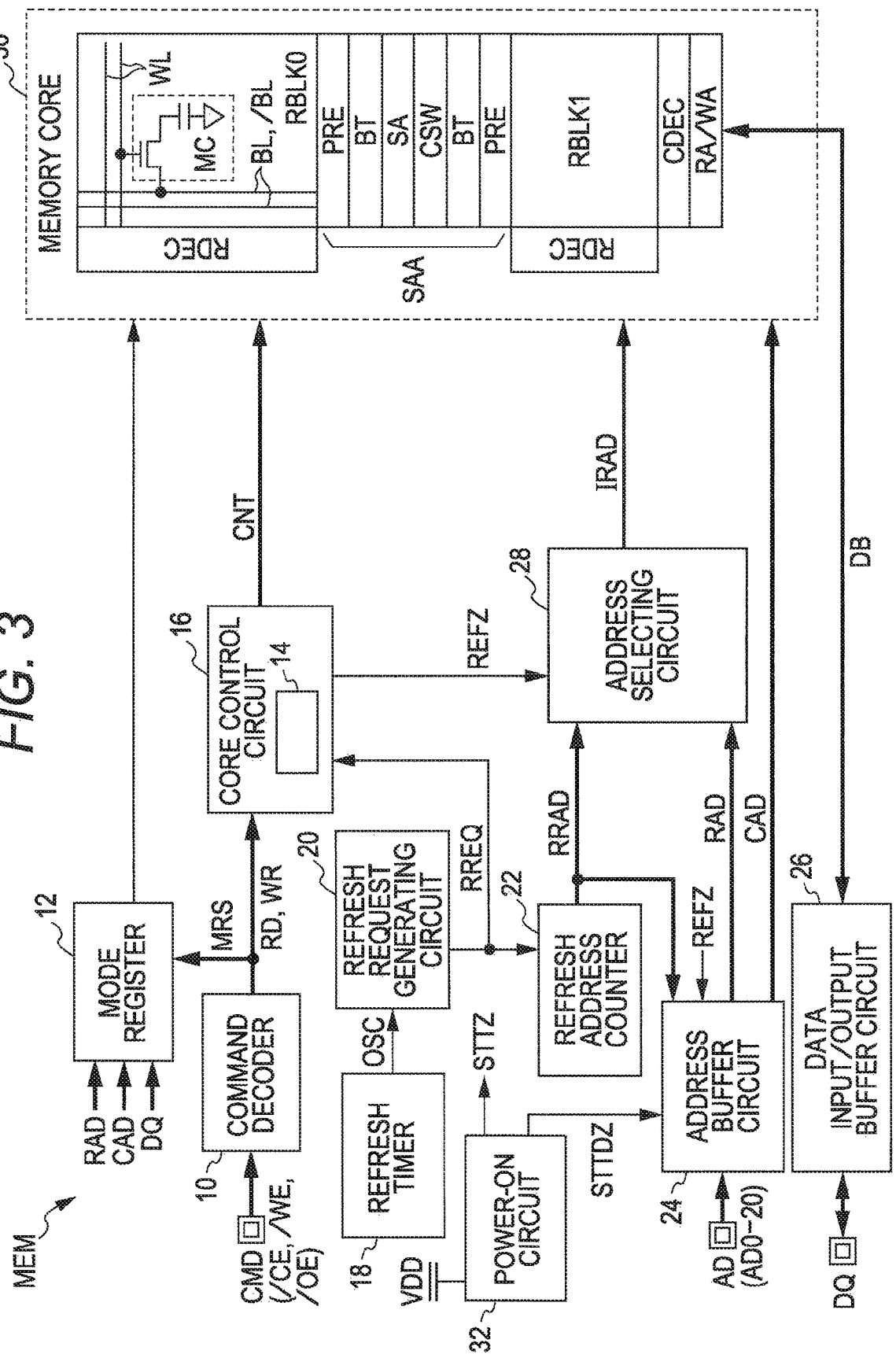
FIG. 3 shows aspects of a third embodiment.

FIG. 3 shows a third embodiment. The same elements as those in the above-mentioned embodiment are denoted by the same numerals, and the explanation thereof are omitted. The semiconductor integrated circuit in the third embodiment is a semiconductor memory MEM, for example.

The semiconductor memory MEM is, for example, an FCRAM (Fast Cycle RAM) of a pseudo-SRAM type. The FCRAM includes a DRAM memory cell and an interface of an SRAM. The memory MEM includes a command decoder 10, a mode register 12, a core control circuit 16 having an arbiter 14, a refresh timer 18, a refresh request generating circuit 20, a refresh address counter 22, an address buffer circuit 24, a data input/output buffer circuit 26, an address selecting circuit 28, a memory core 30, and a power-on circuit 32.

Figure 8:
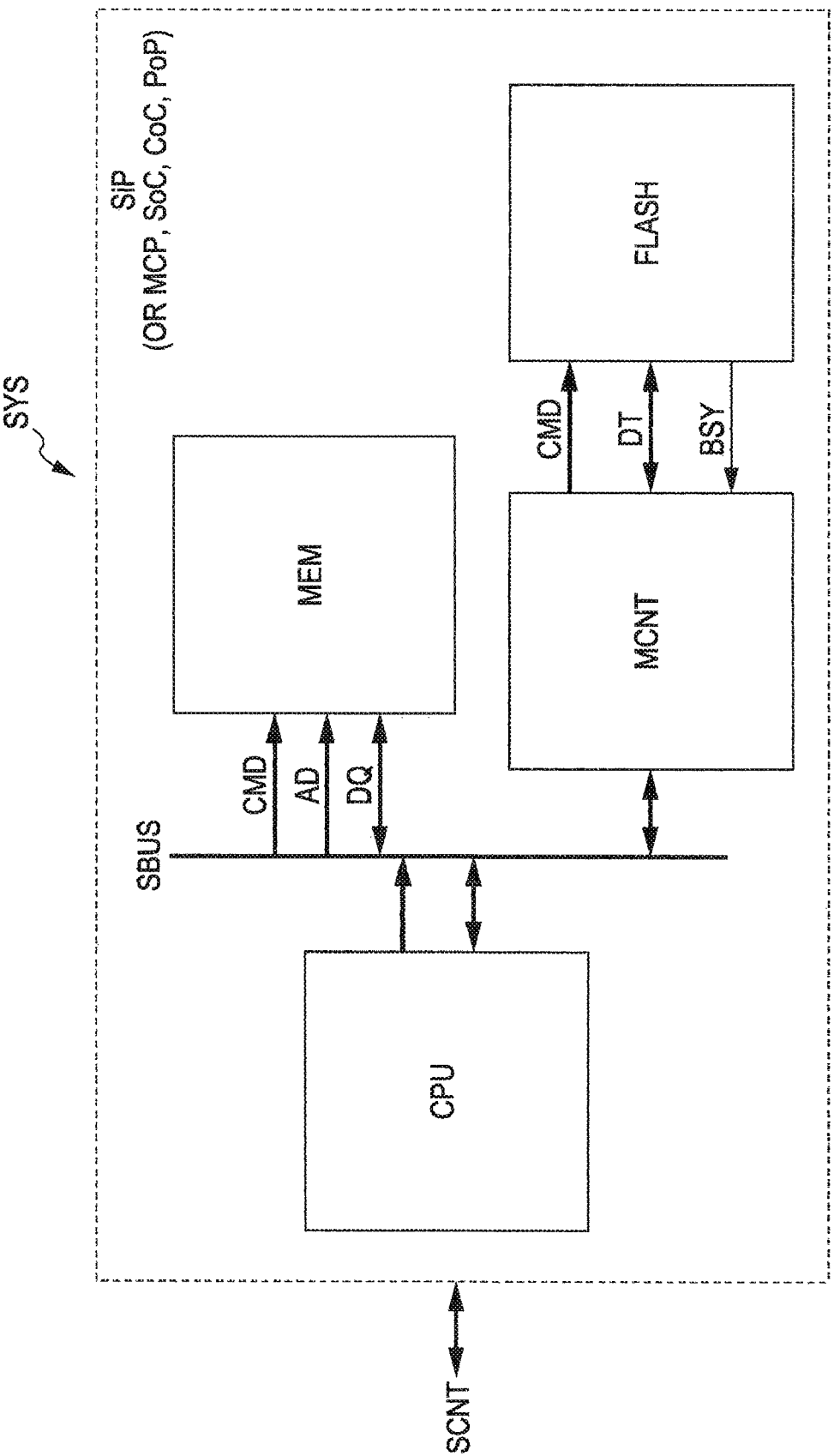
FIG. 8 shows aspects of a system on which a semiconductor memory is mounted.

Although not shown, the memory MEM includes a redundant circuit for repairing a defective memory cell or the like, a redundant fuse circuit, and a redundant control circuit. For example, the redundant circuit includes a redundant memory cell, a redundant sub-word line coupled to the redundant memory cell, a redundant main-word line, a redundant sub-word decoder coupled to the redundant sub-word line and the redundant main-word line, a redundant sub-word driver coupled to the redundant sub-word decoder, and a redundant main-word decoder coupled to the redundant main-word line. The redundant fuse circuit stores a defective address. The redundant control circuit detects that the address signal coincides with the defective address, thereby inhibiting the access of the normal memory cell and allowing the access of the redundant memory cell. The memory MEM constitutes the system together with a CPU as shown in FIG. 8.

The command decoder 10 outputs a command, which is recognized in accordance with a command signal CMD (chip enable signal /CE, write enable signal /WE and output enable signal /OE), as a read command RD and a write command WR for accessing to the memory core 30 or a mode register setting command MRS for setting the mode register 12, or the like. The read command RD and the write command WR are external access requests for accessing the memory core 30.

The mode register 12 includes plural registers that are set on receipt of at least one row address signal RAD, a column address signal CAD and a data signal DQ in synchronism with the mode register setting command MRS. The memory MEM operates with an operation mode according to a value set to the register. When the memory has only one operation mode, the mode register 12 may be unnecessary.

The core control circuit 16 sets a refresh signal REFZ to a high-level when executing a refresh operation, and sets the refresh signal REFZ to a low-level when not executing the refresh operation. The arbiter 14 determines the order of priority of the read command RD and the write command WR, and a refresh request RREQ. For example, the core control circuit 16 gives priority to the refresh request RREQ when the core control circuit 16 simultaneously receives the read command RD and the refresh request RREQ. The reading operation, in response to the read command RD, is held until the refresh operation in response to the refresh request RREQ is completed. The refresh operation, in response to the refresh request RREQ, is temporarily held when the refresh request RREQ is supplied during the reading operation. The core control circuit 16 outputs a control signal CNT, which controls the access operation (reading operation, writing operation or refresh operation) of the memory core 30, in response to the read command RD, the write command WR or the refresh request RREQ. The control signal CNT includes a timing signal for precharging bit lines BL and /BL, a timing signal for activating a word line WL, a timing signal for activating a sense amplifier SA, etc.

A refresh timer 18 includes an oscillator that outputs an oscillating signal OSC at a predetermined cycle. The refresh request generating circuit 20 divides the frequency of the oscillating signal OSC so as to generate a refresh request signal RREQ. The refresh timer 18 and the refresh request generating circuit 20 periodically generate the refresh request signal RREQ for refreshing the memory cell MC. The refresh address counter 22 sequentially generates a refresh address signal RRAD in synchronism with the refresh request signal RREQ. The refresh address signal RRAD is, for example, a row address signal for selecting the word line WL.

The address buffer circuit 24 simultaneously receives a row address signal RAD (e.g., RAD0-11) and a column address signal CAD (e.g., DAC0-8) supplied to an address terminal AD (e.g., AD0-20) for selecting the memory cell MC to be accessed, and outputs the received addresses. The memory MEM employs an address non-multiplex system. The row address signal RAD is supplied for selecting the word line WL, while the column address signal CAD is supplied for selecting the bit line pairs BL and /BL. The address buffer circuit 24 automatically increases the driving capability when the driving capability of the input buffer (main buffer circuit MBUF in FIG. 4) that receives the address signal AD has deteriorated.

The data input/output buffer circuit 26 includes a data input buffer circuit (not shown) that receives a write data signal through a data terminal DQ (e.g., 16 bits), and outputs the received data signal to a data bus DB. The data input/output buffer circuit 26 includes a data output buffer circuit (not shown) that receives read data, which is read from the memory cell MC, through the data bus DB, and outputs the received signal to the data terminal DQ.

The address selecting circuit 28 selects the refresh address signal RRAD when executing the refresh operation (REFZ=high-level). The address selecting circuit 28 selects the row address signal RAD when not executing the refresh operation (REFZ=low-level), and outputs the selected signal to the memory core 30 as an internal row address signal IRAD.

The memory core 30 includes row blocks RBLK (RBLK0-1; memory block), a row decoder RDEC (RDEC0-1) corresponding to the row blocks RBLK0-1, a sense amplifier area SAA arranged between the row blocks RBLK0 and RBLK1, a column decoder CDEC, a read amplifier RA, and a write amplifier WA. Among others, the number of the row blocks RBLK may be four (4), eight (8), or ten (10). The sense amplifier area SAA includes precharge circuits PRE and connection switches BT corresponding to each of the row blocks RBLK0-1, a sense amplifier SA and a column switch CSW shared with the row blocks RBLK0-1.

The column decoder CDEC decodes the column address signal CAD in order to select the bit line pairs BL and /BL in number corresponding to the bit number of the data terminal DQ. The read amplifier RA amplifies the complemented read data output via the column switch CSW during the reading access operation. The write amplifier WA amplifies the complemented write data supplied via the data bus DB during the write access operation, and supplies the amplified write data to the bit line pairs BL and /BL. The memory core 30 may be, for example, a normal DRAM or pseudo-SRAM.

The power-on circuit 32 sequentially activates starter signals STTZ and STTDZ when the power supply voltage VDD supplied from the outside of the memory MEM exceeds a predetermined voltage (e.g., first voltage; 1 V). The starter signal STTZ is supplied to a latch circuit or the like that needs to be reset during the power-on of the memory MEM. The starter signal STTDZ is supplied to the address buffer circuit 24.

Figure 4:
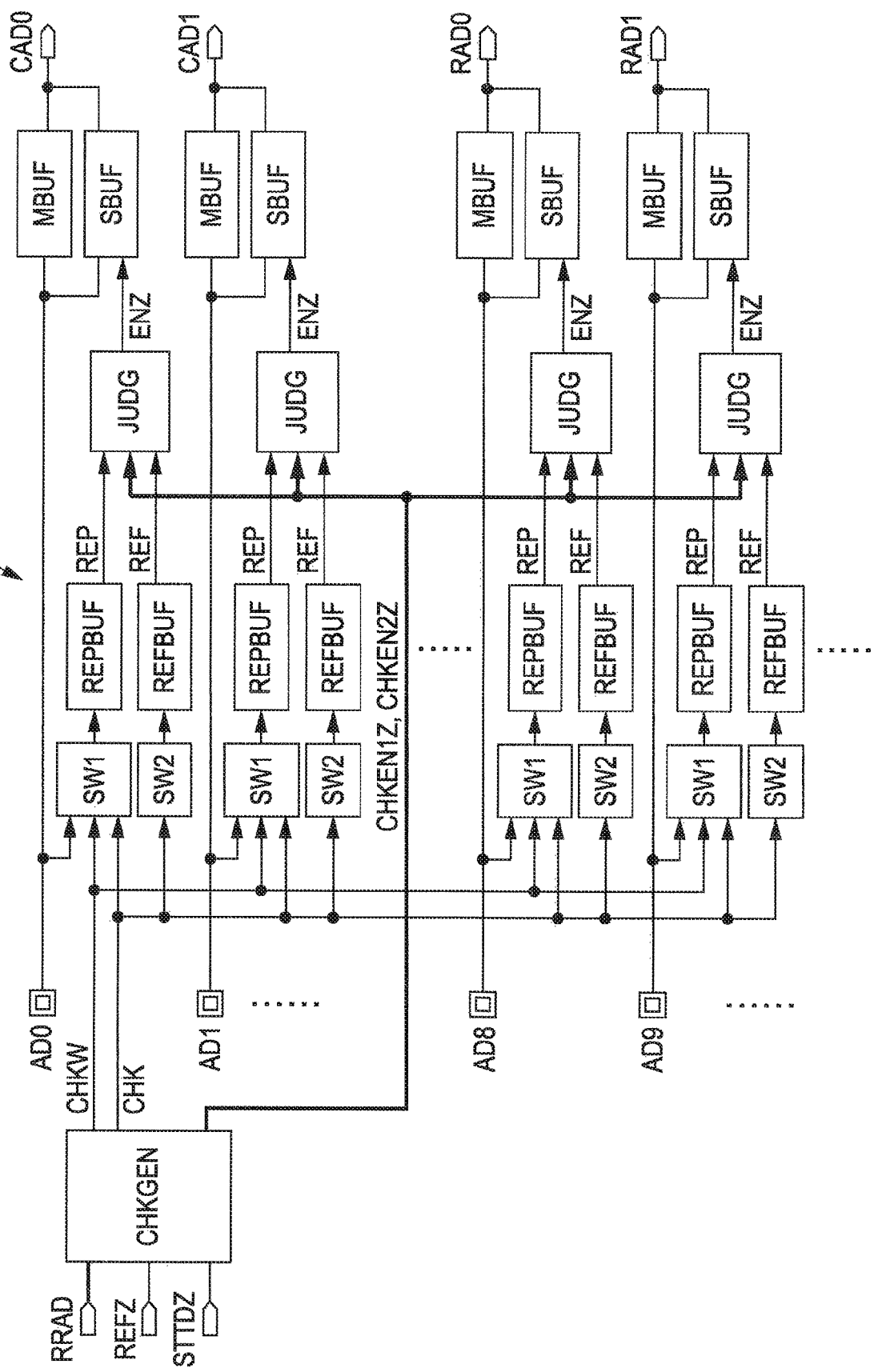
FIG. 4 shows aspects of an exemplary address buffer circuit.

FIG. 4 shows one example of the address buffer circuit 24 according to the third embodiment. The address buffer circuit 24 includes a check signal generating circuit CHKGEN that is common to address terminals AD, and switch circuits SW1 and SW2, a replica buffer circuit REPBUF, a reference buffer circuit REFBUF, a determination circuit JUDG, a main buffer circuit MBUF, and a sub-buffer circuit SBUF, which correspond to each address terminal AD.

The check signal generating circuit CHKGEN generates check signals CHKW and CHK and check enable signals CHKEN1Z and CHKEN2Z when the value of the refresh address signal RRAD goes back to the start. The refresh address signal RRAD makes a round at a predetermined frequency. Specifically, the check signal generating circuit CHKGEN generates the check signal CHK at a predetermined frequency, whereby the deterioration of the electrical characteristic of the main buffer circuit MBUF is checked at a predetermined frequency. In the third embodiment, the check signal CHK and the check enable signals CHKEN1Z and CHKEN2Z are generated by utilizing the refresh address counter 22 that is required for the refresh operation of the memory MEM. A new counter for generating a timing of the check is unnecessary. The chip size of the memory MEM decreases.

The check signal generating circuit CHKGEN generates the check signals CHKW and CHK and check enable signals CHKEN1Z and CHKEN2Z when the starter signal STTDZ generated upon the power-on is activated. The electrical characteristic of the main buffer circuit MBUF is checked for deterioration every time the power is turned on, before the address buffer circuit 24 is operated.

The switch circuit SW1 outputs the address signal AD to the replica buffer circuit REPBUF when the check signal CHKW is at low-level (during the normal state), while outputs the check signal CHK to the replica buffer circuit REPBUF when the check signal CHKW is at high-level (during the check state). The switch circuit SW2 outputs the check signal CHK to the reference buffer circuit REFBUF when the check signal CHKW is at high-level.

The replica buffer circuit REPBUF has the same configuration as that of the main buffer circuit MBUF, for example.

The replica buffer circuit REPBUF outputs the replica output signal REP on receipt of the address signal AD0 (replica input signal) during the normal state, and outputs the replica output signal REP on receipt of the check signal CHK during the check state. The reference buffer circuit REFBUF outputs the reference output signal REF on receipt of the check signal CHK during the check state.

The determination circuit JUDG receives the replica output signal REP and the reference output signal REF. When the determination circuit JUDG detects that the replica output signal REP is later than the reference output signal REF, the determination circuit JUDG activates the enable signal ENZ. The determination circuit JUDG determines during the activation of the check enable signal CHKEN1Z or CHKEN2Z. The main buffer circuit MBUF receives the address signal AD0, and outputs the received signal as a column address signal CAD0. The sub-buffer circuit SBUF operates during the activation of the enable signal ENZ, receives the address signal AD0, and outputs the received signal as the column address signal CAD0. The output of the sub-buffer circuit SBUF is coupled to the output of the main buffer circuit MBUF.

Figure 5:
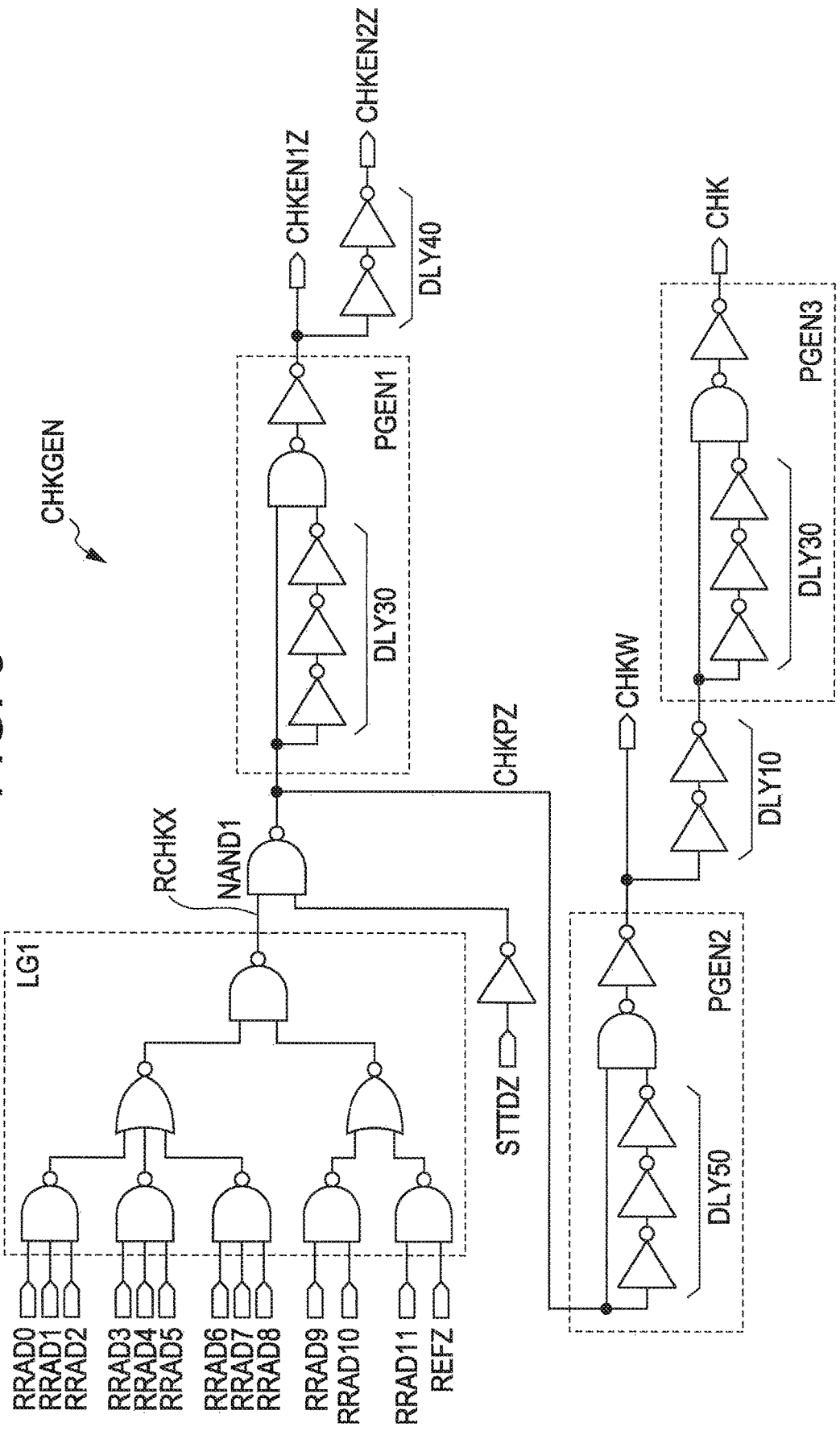
FIG. 5 shows aspects of an exemplary check signal generating circuit.

FIG. 5 shows one example of the check signal generating circuit according to the third embodiment. The check signal generating circuit CHKGEN includes pulse generating circuits PGEN1-3 and delay circuits DLY10 and DLY40. Each of the pulse generating circuits PGEN 1-3 includes a logic circuit LG1, NAND gate NAND1, delay circuits DLY 30, DLY50, and DLY30.

The logic circuit LG1 activates a check signal RCHKX when all of the refresh address signals RRAD0-11 and refresh signal REFZ are at high-level. The NAND gate NAND1 outputs a check pulse signal CHKPZ in synchronism with the activation of the check signal RCHKX or the starter signal STTDZ. The pulse generating circuit PGEN1 generates the check enable signal CHKEN1Z in synchronism with the check pulse signal CHKPZ. The pulse generating circuit PGEN2 generates the check signal CHKW in synchronism with the check pulse signal CHKPZ. The pulse generating circuit PGEN3 generates the check signal CHK in synchronism with the check signal CHKW. The number at the end of the delay circuits DLY30 and DLY50 indicates the relative value of the delay time.

Figure 6:
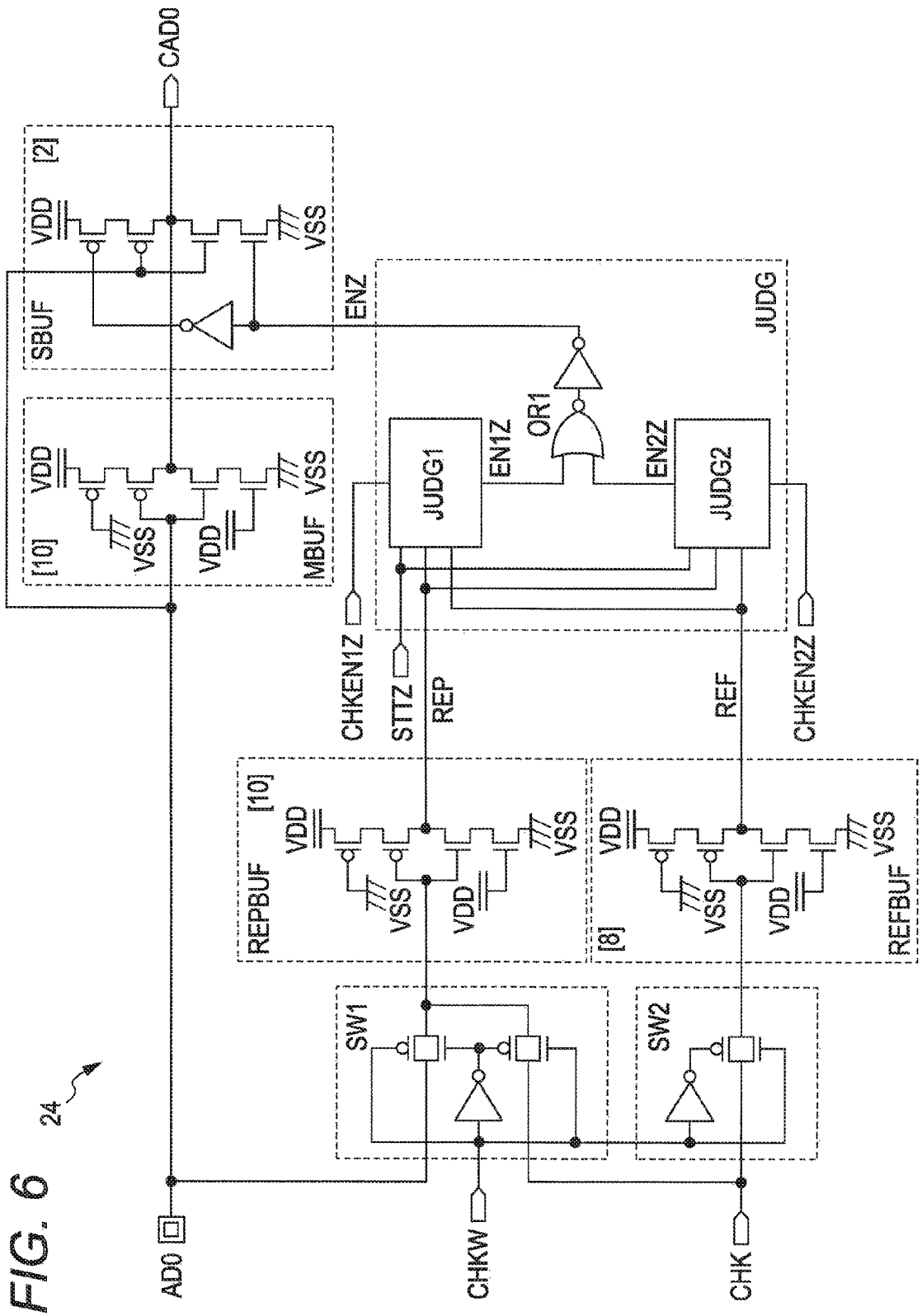
FIG. 6 shows aspects of an exemplary switch circuit, an exemplary buffer circuit, and an exemplary determination circuit.

FIG. 6 shows one example of the switch circuits SW1 and SW2, the buffer circuits MBUF, SBUF, REPBUF and REFBUF, and the determination circuit JUDG, corresponding to the AD0 in the third embodiment. The switch circuits SW1 and SW2, the buffer circuits MBUF, SBUF, REPBUF and REFBUF, and the determination circuit JUDG, which corresponds to another address signals AD 1-20, have the same configuration as those in FIG. 6. The numerical values in parentheses in the buffer circuits MBUF, SBUF, REPBUF and REFBUF indicate the relative values of the driving capability of the buffer circuits MBUF, SBUF, REPBUF and REFBUF. The driving capability corresponds to the maximum output current when the buffer circuits MBUF, SBUF, REPBUF and REFBUF output the high-level signal, or the maximum output current when the buffer circuits MBUF, SBUF, REPBUF and REFBUF output the low-level signal.

The main buffer circuit MBUF includes a CMOS inverter. A source of a pMOS transistor of the CMOS inverter is coupled to the power supply line VDD via the pMOS transistor whose gate is coupled to a ground line VSS. For example, a power supply voltage VDD supplied from the outside of the memory MEM is supplied to the power supply line VDD. A source of an nMOS transistor of the CMOS inverter is coupled to the ground line VSS via the nMOS transistor whose gate is coupled to the power supply line VDD. The sub-buffer circuit SBUF includes a clocked CMOS inverter that operates when receiving the enable signal at high-level.

The switch circuit SW1 includes a pair of switches (CMOS transmission gate) that is turned on or off according to the level of the check signal CHKW. The switch circuit SW1 inhibits the supply of the address signal AD0 to the replica buffer circuit REPBUF when the check signal CHK is supplied. Since the replica buffer circuit REPBUF deteriorates with the main buffer circuit MBUF, the replica buffer circuit REPBUF may monitor the deterioration of the electrical characteristic of the main buffer circuit MBUF.

The switch circuit SW2 includes a switch (CMOS transmission gate) that is turned on or off according to the level of the check signal CHKW. In the third embodiment, the check signal CHK is supplied only when the determination circuit JUDG is operated, so that the switch circuit SW2 may not be formed.

Loads of the CMOS transmission gates in the switch circuit SW2 are equally set. The switch circuit is arranged so that the supplying timings of the check signal CHK supplied to the replica buffer circuit REPBUF and the reference buffer circuit REFBUF become equal to each other. A load circuit (pull-down circuit or the like) for preventing the input of the reference buffer circuit REFBUF from becoming a floating state during the OFF of the switch circuit SW2 may be coupled to the input of the reference buffer circuit REFBUF. In this case, it is desirable that the same load circuit is coupled to the input of the replica buffer circuit REPBUF in order to make the loads equal.

The replica buffer circuit REPBUF includes the same CMOS inverter as that in the main buffer circuit MBUF. The configuration of the reference buffer circuit REFBUF is the same as the configurations of the main buffer circuit MBUF and the replica buffer circuit REPBUF. The reference buffer circuit REFBUF includes a CMOS inverter whose driving capability is smaller compared to the main buffer circuit MBUF and the replica buffer circuit REPBUF. The reference output signal REF generated in response to the check signal CHK in the initial state in which the replica buffer circuit REPBUF has not deteriorated is transmitted to the determination circuit JUDG behind the replica output signal REP.

When the generation of the replica output signal REP is delayed with the deterioration of the replica buffer circuit REPBUF, the delay of the reference output signal REF with respect to the replica output signal REP is gradually decreased. When the deterioration of the replica buffer circuit REPBUF advances further, the reference output signal REF is transmitted to the determination circuit JUDG before the replica output signal REP.

The determination circuit JUDG includes determination sections JUDG1 and JUDG2 and an OR circuit OR1. The determination section JUDG1 activates the enable signal EN1Z when the determination circuit JUDG detects that the rising edge of the replica output signal REP is later than the rising edge of the reference output signal REF during the activation period of the check enable signal CHKEN1Z. The determination section JUDG2 activates the enable signal EN2Z when the determination section JUDG2 detects that the falling edge of the replica output signal REP is later than the falling edge of the reference output signal REF during the activation period of the check enable signal CHKEN2Z. The OR circuit OR1 activates the enable signal ENZ in response to either one of the enable signals EN1Z and EN2Z. The enable signal ENZ is a detection signal indicating the deterioration of the replica buffer circuit REPBUF and the main buffer circuit MBUF. The determination circuit JUDG compares the timing of the transition edge of the replica output signal REP and the timing of the transition edge of the reference output signal REF, and outputs the detection signal EN1Z or EN2Z according to the result of the comparison.

Figure 7:
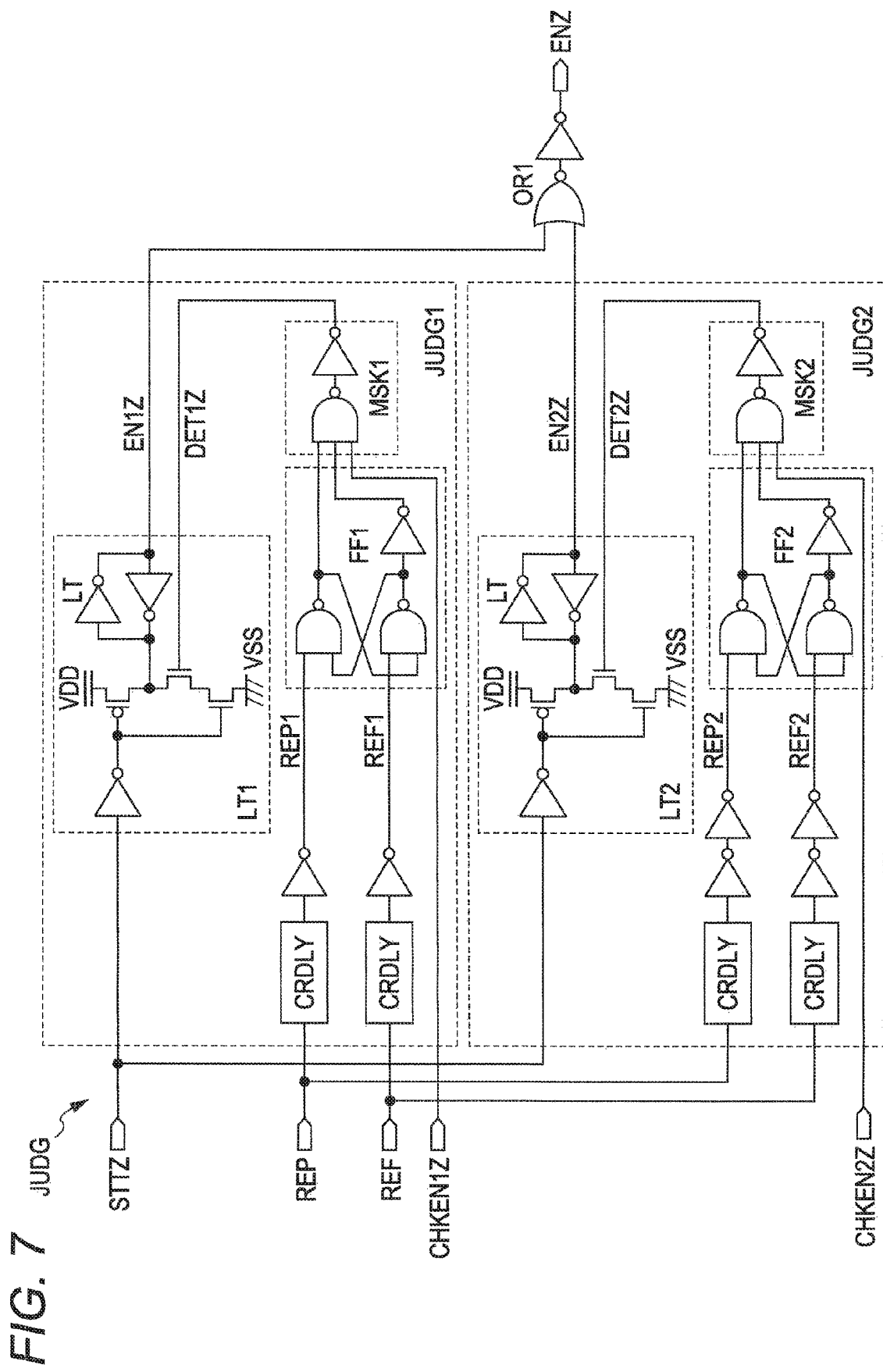
FIG. 7 shows aspects of an exemplary determination circuit.

FIG. 7 shows one example of the determination circuit JUDG according to the third embodiment. The determination section JUDG1 includes CR time-constant circuits CRDLY that respectively receive the replica output signal REP and the reference output signal REF, a flip-flop FF1, a mask section MSK1 and a latch section LT1. The CR time-constant circuit CRDLY dulls the transition edge of the replica output signal REP and the transition edge of the reference output signal REF. The difference between the transition edge of the replica output signal REP and the transition edge of the reference output signal REF can be expanded more than the actual difference by the CR time-constant circuit CRDLY. Therefore, the detection sensitivity of the flip-flop FF1 may be enhanced.

The flip-flop FF1 operates on receipt of the replica output signal REP1 or the reference output signal REF1 obtained by inversing the logic of the signals output from the time-constant circuits CRDLY. The mask section MSK1 outputs a detection signal DET1Z according to the output of the flip-flop FF1 during the high-level period of the check enable signal CHKEN1Z. The mask section MSK1 outputs a detection signal DET1Z at low-level during the low-level period of the check enable signal CHKEN1Z. The latch section LT1 includes a latch LT. The latch LT is reset upon the activation of the starter signal STTZ so as to deactivate the enable signal EN1Z. The latch LT is set in synchronism with the activation of the detection signal DET1Z so as to activate the enable signal EN1Z.

When, during the period of the activation of the check enable signal CHKEN1Z, the determination section JUDG1 receives the rising edge (the falling edge of the REP signal) of the replica output signal REP1 after receiving the rising edge (the falling edge of the REF signal) of the reference output signal REF1, the determination section JUDG1 activates the detection signal DET1Z. The determination section JUDG1 compares the timing of the falling edge of the replica output signal REP and the timing of the falling edge of the reference output signal REF, and outputs the detection signal DET1Z (ENZ) according to the result of the comparison. Therefore, the deterioration of the nMOS transistor of the main buffer circuit MBUF is detected.

Comparing the determination section JUDG2 to the determination section JUDG1, the determination section JUDG2 includes one more inverters arranged between the CR time-constant circuits CRDLY and the flip-flop FF2. When, during the period of the activation of the check enable signal CHKEN2Z, the determination section JUDG2 receives the falling edge (the rising edge of the REP signal) of the replica output signal REP2 after receiving the falling edge (rising edge of the REF signal) of the reference output signal REF2, the determination section JUDG2 activates the detection signal DET2Z. The determination section JUDG2 compares the timing of the rising edge of the replica output signal REP and the timing of the rising edge of the reference output signal REF, and outputs the detection signal DET2Z (ENZ) according to the result of the comparison. Therefore, the deterioration of the pMOS transistor of the main buffer circuit MBUF is detected.

FIG. 8 shows the system SYS on which the semiconductor memory MEM shown in FIG. 3 is mounted. The system SYS is, for example, a portable device such as a cellular phone or the like. The semiconductor integrated circuits shown in FIGS. 1 and 2 and a semiconductor integrated circuit described below are also mounted on the system shown in FIG. 8. The system SYS includes a system-in package SiP having plural chips mounted on a package substrate such as a lead frame or the like. Alternatively, the system SYS includes a multi-chip package MCP having plural chips laminated onto the package substrate. Alternatively, the system SYS includes a system-on chip (SoC) having plural macros integrated onto a silicon substrate. Alternatively, the system SYS includes a chip-on-chip (CoC) or package-on-package (PoP).

The SiP includes the semiconductor memory MEM shown in FIG. 3, a flash memory FLASH, a memory controller MCNT that accesses the flash memory FLASH, and a CPU (controller) that controls the entire system. The CPU, memory MEM and memory controller MCNT are coupled via a system bus SBUS. The SiP is coupled to a host system via an external bus SCNT. The CPU outputs the command signal CMD, the address signal AD and the write data signal DQ to the memory MEM, and receives the read data signal DQ from the memory MEM in order to access the memory MEM.

Figure 9:
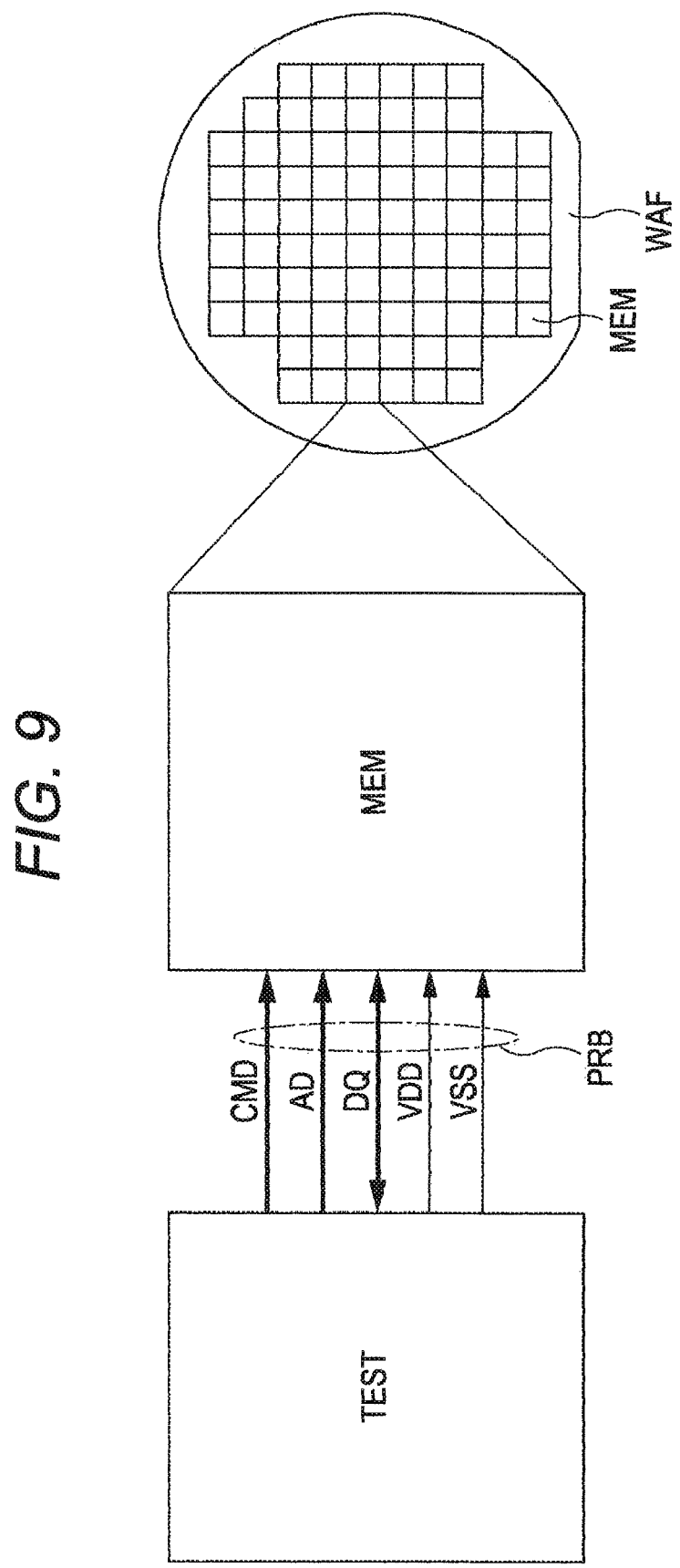
FIG. 9 is a test system for testing a semiconductor memory.

FIG. 9 shows a test system for testing the semiconductor memory MEM shown in FIG. 3. The semiconductor integrated circuit shown in FIGS. 1 and 2 and the semiconductor integrated circuit described below are also tested by the test system shown in FIG. 9. Plural memories MEM are formed on a semiconductor wafer WAF in the semiconductor manufacturing process. The memory MEM is tested by an LSI tester TEST before the memory MEM is cut from the wafer WAF in the test process.

Signals CMD, AD, and DQ that control the access of the memory MEM, the power supply voltage VDD, and the ground voltage VSS are supplied to the memory MEM from the LSI tester TEST. The memory MEM is coupled to the LSI tester TEST through a probe PRB of a probe card not shown, for example. In FIG. 9, one memory MEM is coupled to the LSI tester TEST. However, plural memories MEM (e.g., four) may be coupled together to the LSI tester TEST. The number of the memory MEM coupled together to the LSI tester TEST depends upon the number of the terminal of the LSI tester TEST and the number of the terminal of the memory MEM.

The LSI tester TEST supplies the command signal CMD, address signal AD and write data signal DQ to the memory MEM, and receives the read data signal DQ from the memory MEM. A writing test of data to the memory cell MC and a reading test of data from the memory cell MC are performed, thereby sorting good memories MEM and bad memories MEM. The memory MEM may be tested with the memory chip MEM stored in the package.

Figure 10:
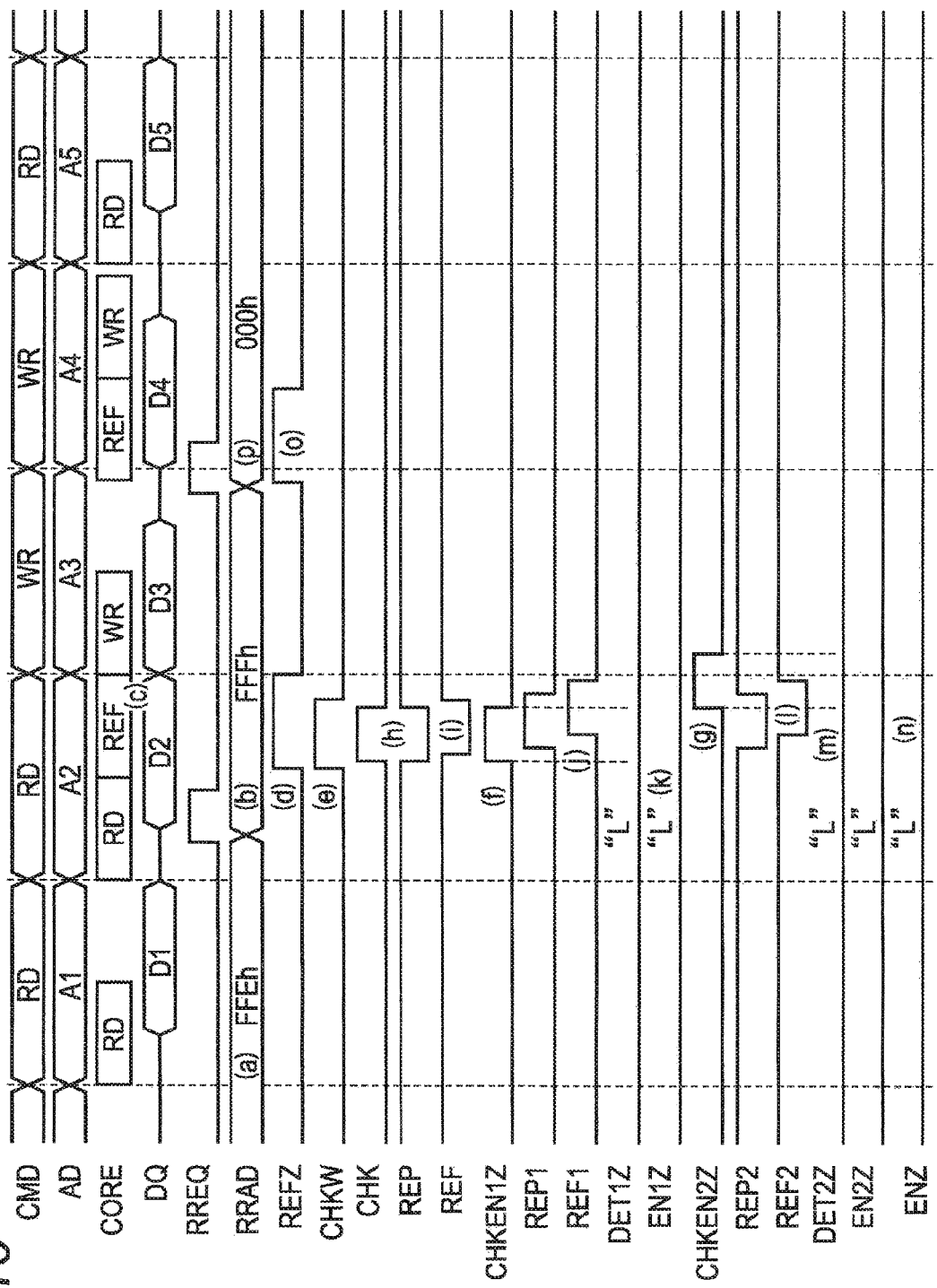
FIG. 10 shows aspects of an exemplary access operation of a memory.

FIG. 10 shows one example of the access operation of the memory MEM according to the third embodiment. FIG. 10 shows the operation before the main buffer circuit MBUF (FIG. 6) of the address buffer circuit 24 has deteriorated. A1 to A5 of the address terminal AD indicate the address signals supplied with the command. The RD, WR and REF of the memory core 30 (CORE) shown in FIG. 3 respectively indicate the period when the read operation RD is performed, the period when the write operation WR is performed, and the period when the refresh operation REF is performed. D1 to D5 of the data terminal DQ indicate the read data signals or write data signals.

In FIG. 10, when the memory MEM sequentially receives the read command RD twice, the write command WR twice and read command RD once, the memory MEM starts to operate. The interval of supplying the command is, for example, 100 ns. The refresh request RREQ is occurred during the second read operation and before the second write operation. The refresh request RREQ is occurred at an interval of several microseconds, for example, but in FIG. 10, the occurrence frequency of the refresh request RREQ is set high for the sake of convenience.

When the first reading command RD is supplied, the refresh address counter 22 shown in FIG. 3 sets the refresh address signal RRAD0-11 (counter value) to "FFE" in the hexadecimal notation (FIG. 10(a)). The refresh address counter 22 is counted up in synchronism with the refresh request RREQ so as to set the counter value to "FFF (maximum value)" (FIG. 10(b)). The arbiter 14 of the core control circuit 16 starts the refresh operation REF after the read operation RD corresponding to the second read command RD is completed (FIG. 10(c)). The refresh signal REFZ is activated during the execution of the refresh operation REF (FIG. 10(d)).

The check signal generating circuit CHKGEN shown in FIG. 5 outputs the check signals CHKW and CHK and the check enable signals CHKEN1Z and CHKEN2Z in synchronism with the refresh signal REFZ when the counter value indicates the maximum value "FFF" (FIG. 10(e, f, g)). The check signal CHKW has a pulse width greater than that of the check signal CHK, and the high-level period of the check signal CHK is included in the high-level period of the check signal CHKW.

During the high-level period of the check signal CHKW, one of the switches in the switch circuit SW1 and the switch circuit SW2 shown in FIG. 6 are turned on, whereby the common check signal CHK is supplied to the replica buffer circuit REPBUF and the reference buffer circuit REFBUF. The replica buffer circuit REPBUF inverts the logic of the check signal CHK so as to output the replica output signal REP (FIG. 10(h)). The reference buffer circuit REFBUF inverts the logic of the check signal CHK so as to output the reference output signal REF (FIG. 10(i)). The replica output signal REP and the reference output signal REF pass through the time-constant circuit CRDLY and the inverter of the determination section JUDG1 shown in FIG. 7, and are supplied to the flip-flop FF1 as the replica output signal REP1 and the reference output signal REF1 whose logic levels are inverted (FIG. 10(j)).

When the main buffer circuit MBUF has not deteriorated, the replica buffer circuit REPBUF has also not deteriorated. The driving capability of the replica buffer circuit REPBUF is greater than the driving capability of the reference buffer circuit REFBUF, and the rising edge of the replica output signal REP1 is generated before the rising edge of the reference output signal REF1. Therefore, the detection signal DET1Z and the enable signal EN1Z are retained at a low-level (FIG. 10(k)). In the determination section JUDG2, the rising edge of the replica output signal REP2 is generated earlier than the rising edge of the reference output signal REF2 (FIG. 10(l)). Therefore, the detection signal DET2Z and the enable signal EN2Z are retained at a low-level (FIG. 10(m)). Accordingly, the enable signal ENZ is not activated, so that the sub-buffer circuit SBUF is not used (FIG. 10(n)).

The refresh operation REF is performed in response to the refresh request RREQ, whereby the refresh signal REFZ is activated (FIG. 10(o)). The refresh address counter 22 shown in FIG. 3 is counted up in synchronism with the refresh request RREQ so as to set the counter value to "000" (FIG. 10(p)). Since the counter value is not the maximum value, the check signal generating circuit CHKGEN does not output the check signals CHKW and CHK and the check enable signals CHKEN1Z and CHKEN2Z. Accordingly, the determination circuit JUDG is not operated.

A counter that counts until the counter value (refresh address signal RRAD) from the refresh address counter 22 reaches the maximum value "FFF" may be provided, and when the counter detects the overflow plural times (e.g., thirty-two times), the check signals CHK and CHKW may be generated.

Figure 11:
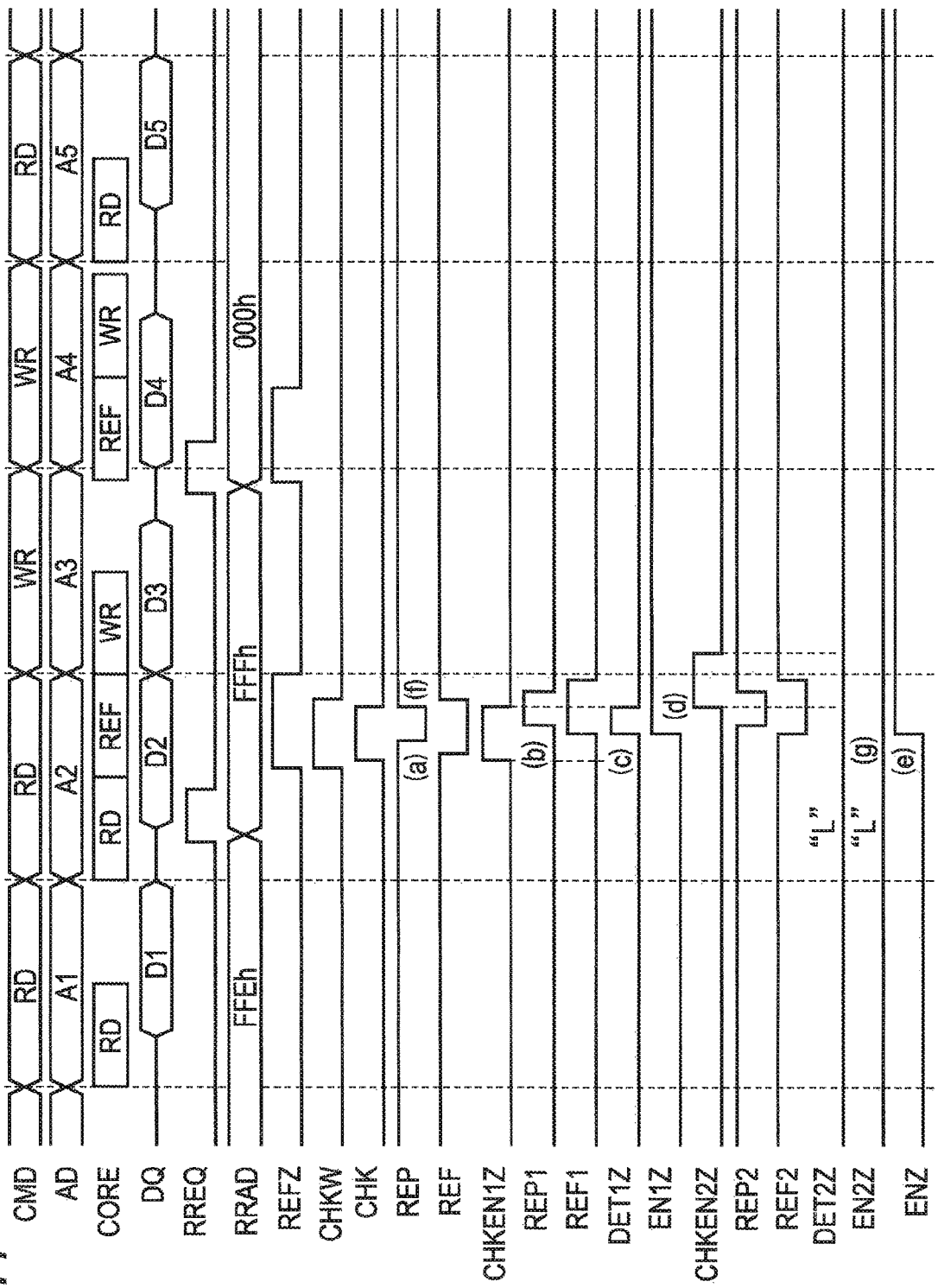
FIG. 11 shows aspects of another exemplary access operation of a memory.

FIG. 11 shows another example of the access operation of the memory MEM according to the third embodiment. FIG. 11 shows the operation when any one of the nMOS transistors of the main buffer circuit MBUF (FIG. 6) of the address buffer circuit 24 has deteriorated. The command and address signal AD supplied to the memory MEM are the same as the command and address signal AD shown in FIG. 10. The timing of generating the refresh request RREQ and the value of the refresh address signal RRAD are the same as those shown in FIG. 10.

When the nMOS transistor of the main buffer circuit MBUF has deteriorated, the capability of supplying the ground current to the output node CAD0 from the main buffer circuit MBUF shown in FIG. 6 decreases. Examples of the deterioration of the nMOS transistor include the phenomenon in which the threshold voltage of the nMOS transistor increases due to hot carriers by electrons and the drain current decreases, whereby the driving capability of the transistor reduces. The replica buffer circuit REPBUF receives the input signal (e.g., address signal AD0) with the same frequency as that of the main buffer circuit MBUF. When the nMOS transistor of the main buffer circuit MBUF has deteriorated, the nMOS transistor of the replica buffer circuit REPBUF has also deteriorated. The timing of the falling edge of the replica output signal REP corresponding to the rising edge of the check signal CHK becomes relatively slow (FIG. 11(a)).

The flip-flop FF1 shown in FIG. 7 receives the rising edge of the replica output signal REP1 behind the rising edge of the reference output signal REF (FIG. 11(b)). The mask section MSK1 receives the output of the flip-flop FF1 so as to activate the detection signal DET1Z (FIG. 11(c)). The enable signals EN1Z and ENZ are activated (FIG. 11(d, e)). The activation state of the enable signal ENZ is retained by the latch section LT1 shown in FIG. 7 while the power supply voltage VDD is supplied to the memory MEM. Therefore, the sub-buffer circuit SBUF shown in FIG. 6 is activated, whereby the sub-buffer circuit SBUF operates with the main buffer circuit MBUF.

In FIG. 11, the pMOS transistor of the main buffer circuit MBUF has not deteriorated. The rising edge of the replica output signal REP appears earlier than the rising edge of the reference output signal REF (FIG. 11(f)). Accordingly, like the case shown in FIG. 10, the detection signal DET2Z and the enable signal EN2Z are not activated (FIG. 11(g)).

Figure 12:
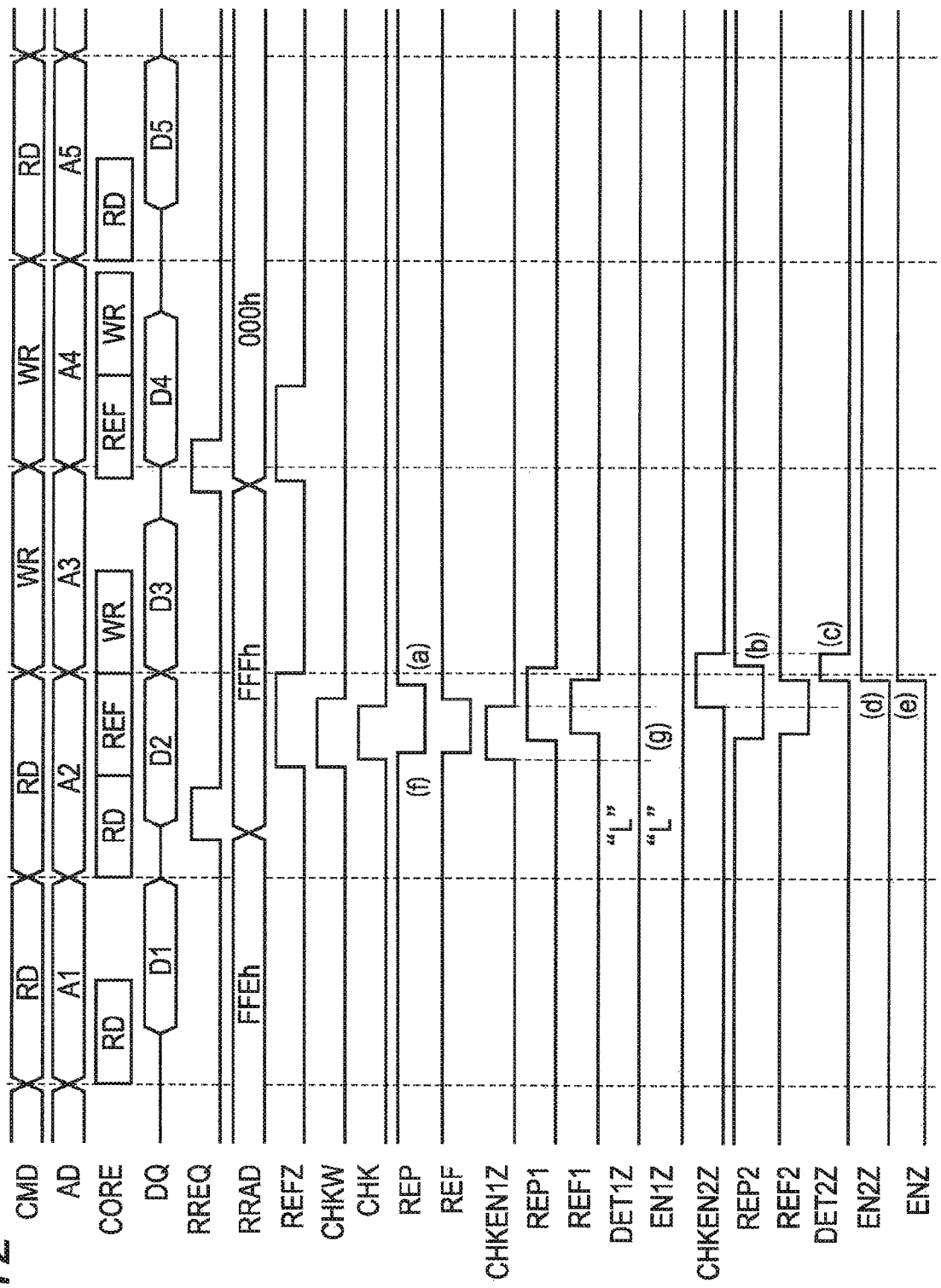
FIG. 12 shows aspects of yet another an exemplary access operation of a memory.

FIG. 12 shows another example of the access operation of the memory MEM according to the third embodiment. FIG. 12 shows the operation when any one of the pMOS transistors of the main buffer circuit MBUF (FIG. 6) of the address buffer circuit 24 has deteriorated. The command and address signal AD supplied to the memory MEM are the same as the command and address signal AD shown in FIG. 10. The timing of generating the refresh request RREQ and the value of the refresh address signal RRAD are the same as those shown in FIG. 10.

When the pMOS transistor of the main buffer circuit MBUF has deteriorated, the capability of supplying the power supply current to the output node CAD0 from the main buffer circuit MBUF shown in FIG. 6 decreases. Examples of the deterioration of the pMOS transistor include the phenomenon in which the threshold voltage (absolute value) of the pMOS transistor increases due to hot carriers by holes and the drain current decreases, whereby the driving capability of the transistor reduces. The replica buffer circuit REPBUF receives the input signal (e.g., address signal AD0) with the same frequency as that of the main buffer circuit MBUF. When the pMOS transistor of the main buffer circuit MBUF has deteriorated, the pMOS transistor of the replica buffer circuit REPBUF has also deteriorated. The timing of the rising edge of the replica output signal REP corresponding to the falling edge of the check signal CHK becomes relatively late (FIG. 12(a)).

The flip-flop FF2 shown in FIG. 7 receives the rising edge of the replica output signal REP2 behind the rising edge of the reference output signal REF2 (FIG. 12(b)). The mask section MSK2 receives the output of the flip-flop FF2 so as to activate the detection signal DET2Z (FIG. 12(c)). The enable signals EN2Z and ENZ are activated (FIG. 12(d, e)). The activation state of the enable signal ENZ is retained by the latch section LT2 shown in FIG. 7 while the power supply voltage VDD is supplied to the memory MEM. Therefore, the sub-buffer circuit SBUF shown in FIG. 6 is activated, whereby the sub-buffer circuit SBUF operates with the main buffer circuit MBUF.

In FIG. 12, the nMOS transistor of the main buffer circuit MBUF has not deteriorated. The falling edge of the replica output signal REP appears before the falling edge of the reference output signal REF (FIG. 12(f)). Accordingly, like the case shown in FIG. 10, the detection signal DET1Z and the enable signal EN1Z are not activated (FIG. 12(g)).

Figure 13:
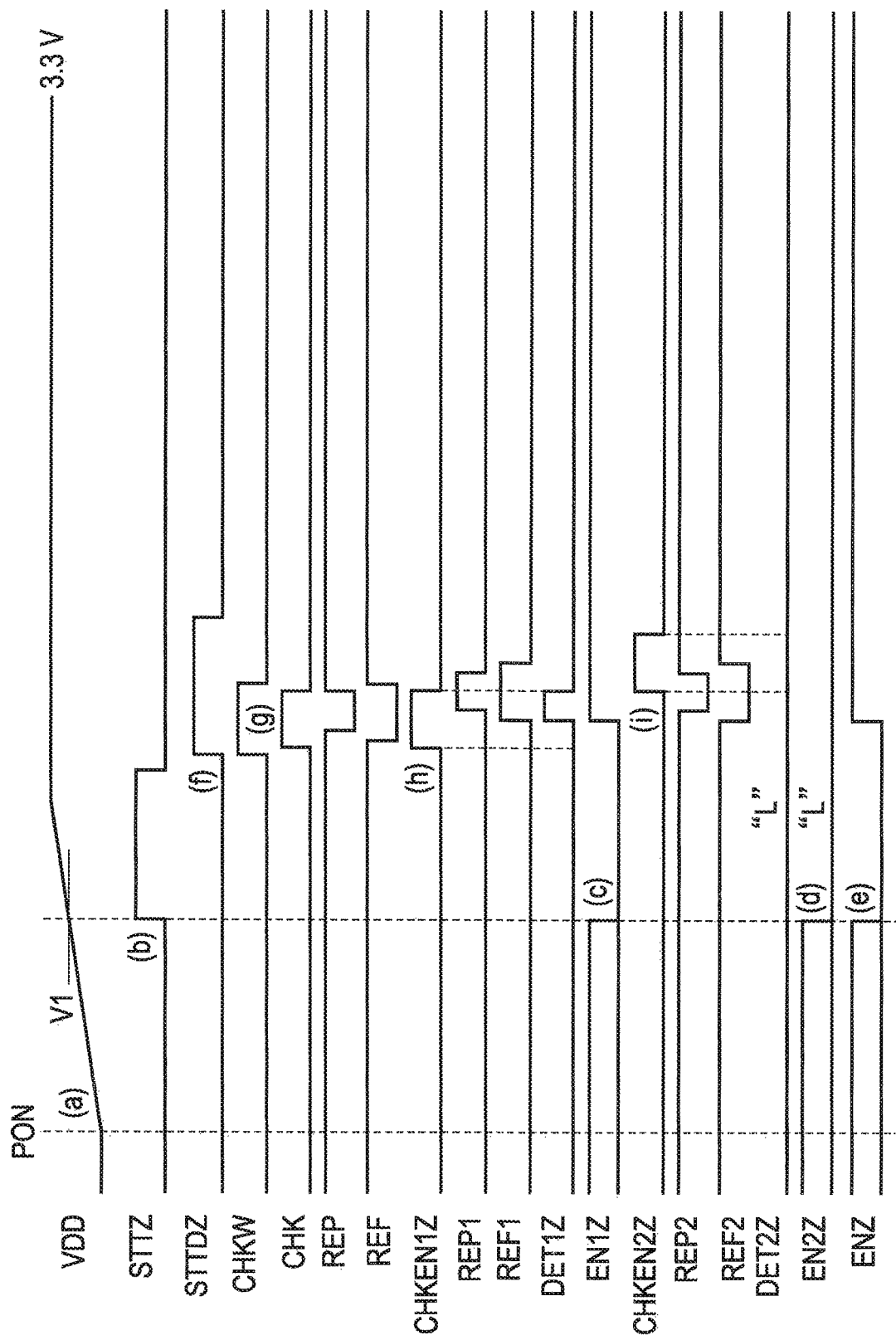
FIG. 13 shows aspects of an exemplary power-on operation of a memory.

FIG. 13 shows an operation of the memory MEM according to the third embodiment when the power is turned on. In FIG. 13, the nMOS transistor of the main buffer circuit MBUF has deteriorated, while pMOS transistor has not deteriorated.

After the power-on PON, the supply of the power supply voltage VDD to the memory MEM is started (FIG. 13(a)). The power-on circuit 32 in FIG. 3 activates the starter signal STTZ in a predetermined period when the power supply voltage VDD exceeds a first voltage V1 (FIG. 13(b)). The power supply voltage VDD rises to 3.3 V, for example. The latch sections LT1 and LT2 shown in FIG. 7 are reset in synchronism with the activation of the starter signal STTZ so as to deactivate the enable signals EN1Z and EN2Z (FIG. 13(c, d)). The enable signal ENZ is deactivated (FIG. 13(e)).

After deactivating the starter signal STTZ, the power-on circuit 32 activates the starter signal STTDZ (FIG. 13(f)). The check signal generating circuit CHKGEN shown in FIG. 5 outputs the check signals CHKW and CHK and the enable signals CHKEN1Z and CHKEN2Z in synchronism with the activation of the starter signal STTDZ (FIG. 13(g, h, i)). Since only the nMOS transistor has deteriorated in FIG. 13, the waveform afterwards becomes the same as the waveform shown in FIG. 11.

In FIG. 13, the switch circuits SW1 and SW2, the replica buffer circuit REPBUF, the reference buffer circuit REFBUF, and the determination circuit JUDG are provided so as to correspond to the address terminals AD0-20. The operations shown in FIGS. 11 to 13 are performed for every address terminals AD0-20.

When it is found beforehand that only the threshold voltage of the nMOS transistor increases due to hot carriers or the like, and only any one of the nMOS transistors of the main buffer circuit MBUF has deteriorated, the determination section JUDG2 and OR circuit OR1 shown in FIG. 7 are unnecessary. When it is found beforehand that only any one of the pMOS transistors of the main buffer circuit MBUF has deteriorated, the determination section JUDG1 and the OR circuit OR1 shown in FIG. 7 are unnecessary.

Figure 14:
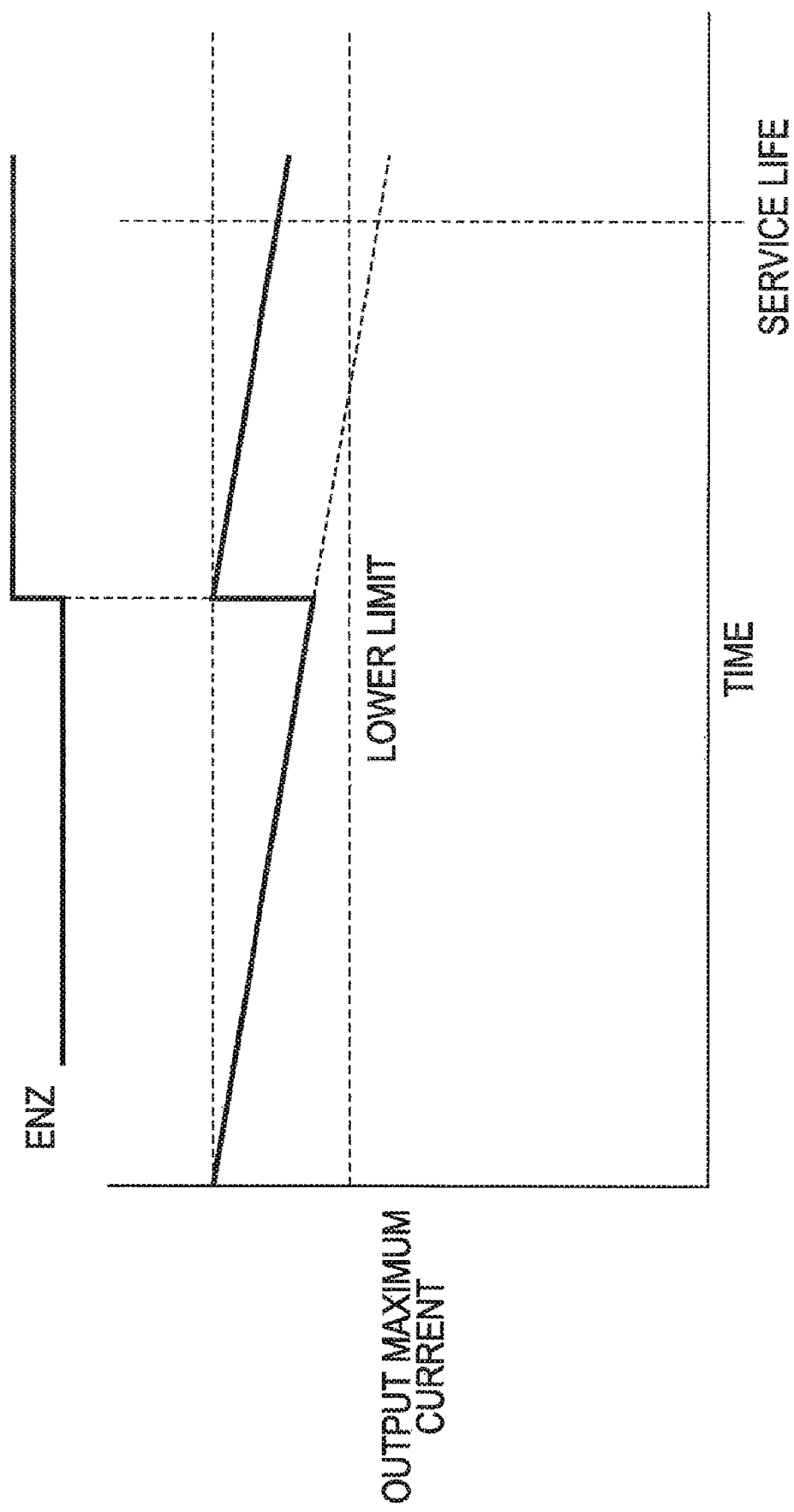
FIG. 14 shows aspects of an exemplary change in the maximum output current of buffer circuits.

FIG. 14 shows one example of a change in the maximum output current of the buffer circuits MBUF and SBUF. FIG. 14 shows the change in the maximum output current of the buffer circuits MBUF and SBUF in the address buffer circuit 24 corresponding to each of the address terminals AD in the address buffer circuit 24 when the enable signal ENZ is activated in FIGS. 11 to 13.

For example, when the threshold voltage of the transistor gradually increases due to the hot carriers or the like, the maximum output current of the main buffer circuit MBUF gradually decreases. When the determination circuit JUDG detects the deterioration of the main buffer circuit MBUF and activates the enable signal ENZ, the main buffer circuit MBUF and the sub-buffer circuit SBUF are used to generate the output current. Since the maximum output current increases, the memory MEM does not operate erroneously.

The main buffer circuit MUBF and the sub-buffer circuit SUBF are gradually deteriorated due to the hot carriers or the like. The service life of the product is set to the point before the maximum output current falls below the lower limit. The characteristic shown in FIG. 14 is applied to the first and second embodiments and the embodiments described later.

The third embodiment has the same effect as that of the first embodiment. In the third embodiment, when the deterioration of the main buffer circuit MBUF of the address buffer circuit 24 is detected, the sub-buffer circuit SBUF is operated so as to prevent the reduction in the driving capability of the address buffer circuit 24F.

Figure 15:
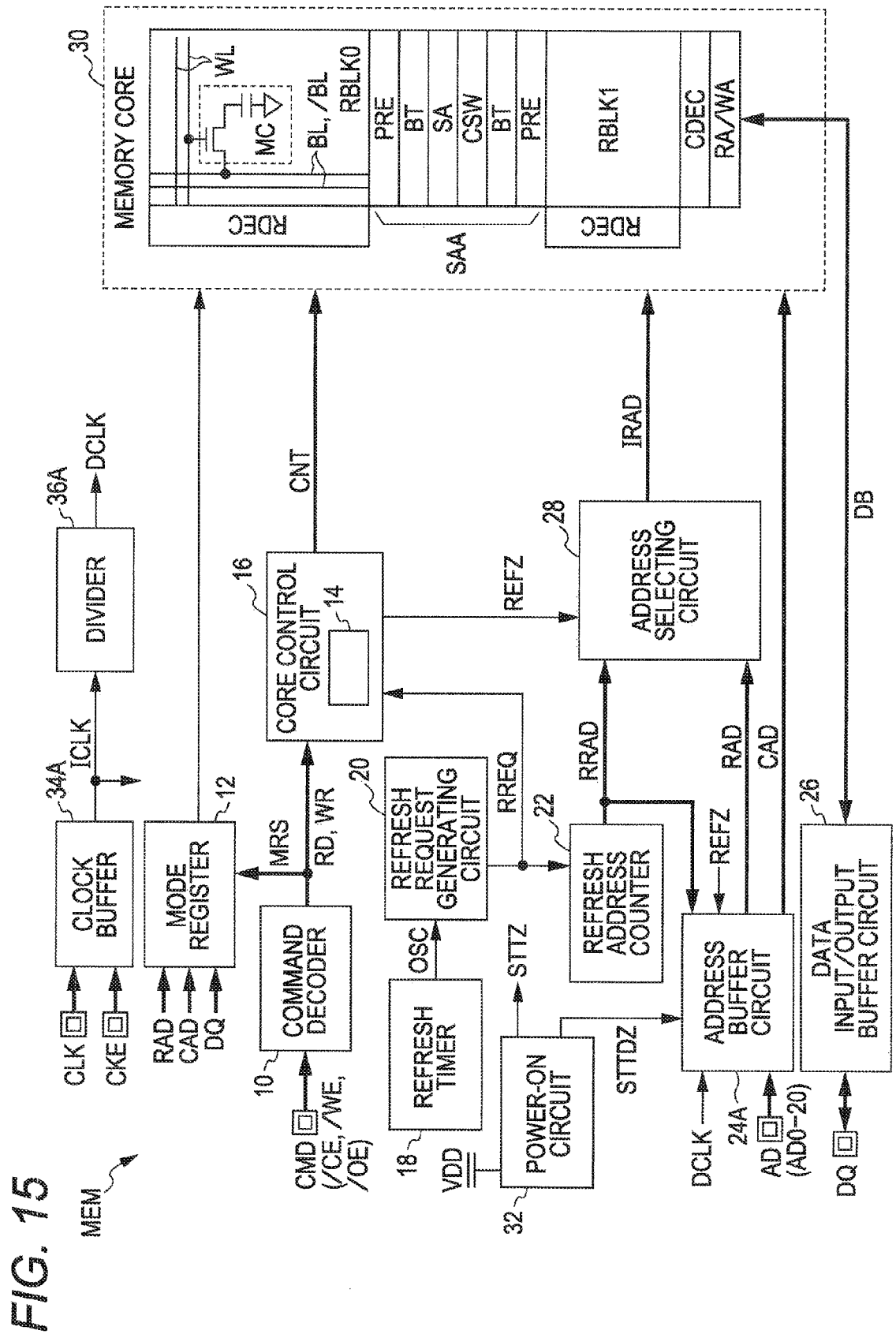
FIG. 15 shows aspects of a fourth embodiment.

FIG. 15 shows a fourth embodiment. In the fourth embodiment, the same elements as those in the above-mentioned embodiments are denoted by the same numerals, and the explanation thereof are omitted. In the fourth embodiment, the semiconductor integrated circuit may be a semiconductor memory MEM (FCRAM). The semiconductor memory MEM in the fourth embodiment includes an address buffer circuit 24A instead of the address buffer circuit 24 shown in FIG. 3. The semiconductor memory MEM in the fourth embodiment includes a clock buffer 34A and a divider 36A. The memory MEM in the fourth embodiment operates in synchronism with the clock signal CLK. The other configuration of the fourth embodiment is the same as that of the third embodiment.

The clock buffer 34A supplies the clock signal CLK to the internal circuit as the internal clock signal ICLK during when the clock buffer 34A receives a clock enable signal CKE at high-level. The divider 36A divides the frequency of the internal clock signal ICLK and outputs the resultant as a frequency-divided clock signal DCLK. The frequency-divided clock signal DCLK is supplied to the address buffer circuit 24A. The frequency-divided clock signal DCLK is generated on the basis of the clock signal CLK, whereby a circuit such as an oscillator for generating the frequency-divided clock signal DCLK is unnecessary. The chip size of the memory MEM may be reduced.

Figure 16:
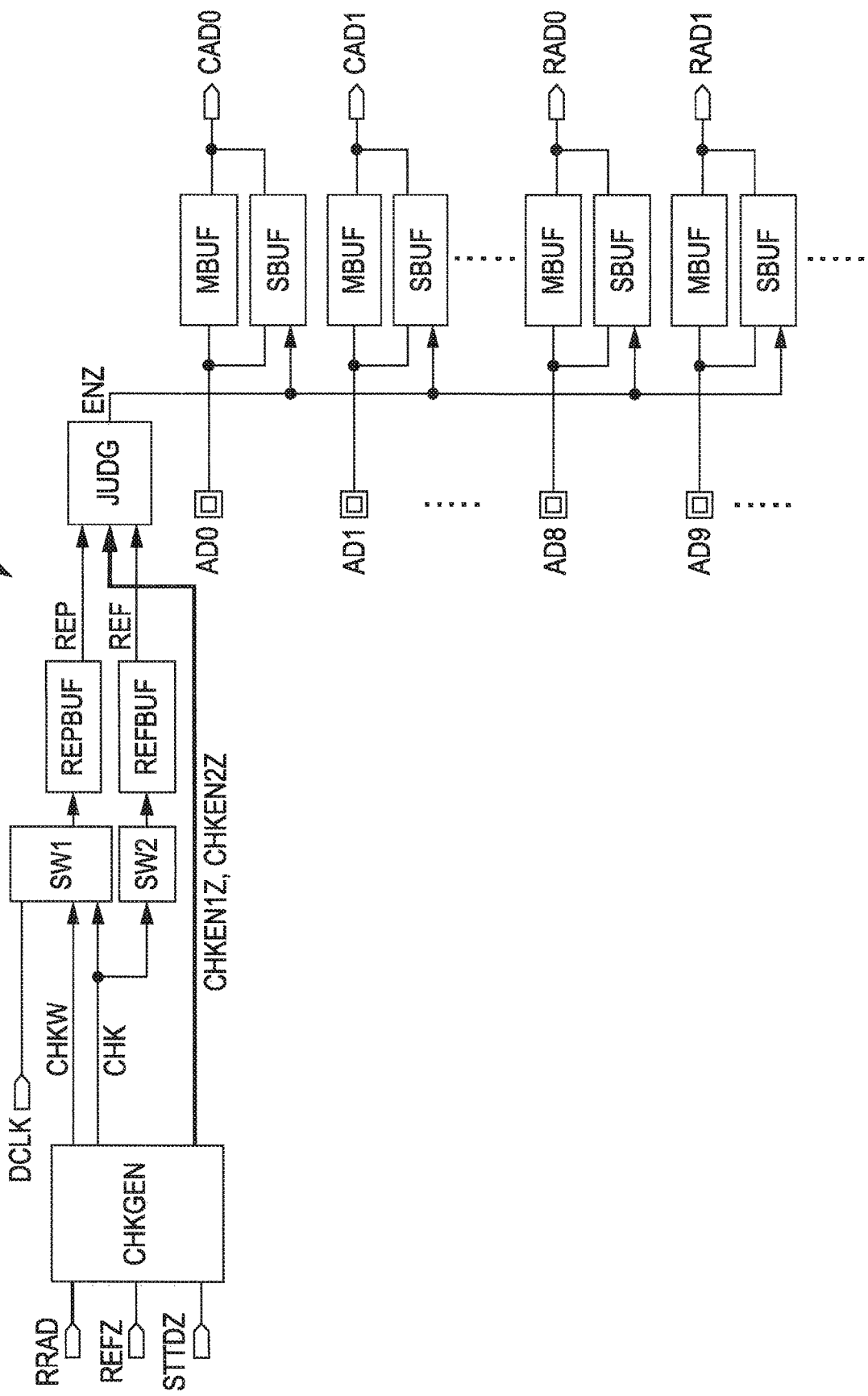
FIG. 16 shows aspects of an exemplary address buffer circuit.

FIG. 16 shows one example of the address buffer circuit shown in FIG. 15. In FIG. 16, switch circuits SW1 and SW2, a replica buffer circuit REPBUF, a reference buffer circuit REFBUF and a determination circuit JUDG are provided so as to be common to a buffer section (a main buffer circuit MBUF and a sub-buffer circuit SBUF) corresponding to each address terminal AD. The switch circuit SW1 receives the frequency-divided clock signal DCLK, not the address signal AD, as the replica input signal. The other configuration shown in FIG. 16 is the same as that in FIG. 4.

Figure 17:
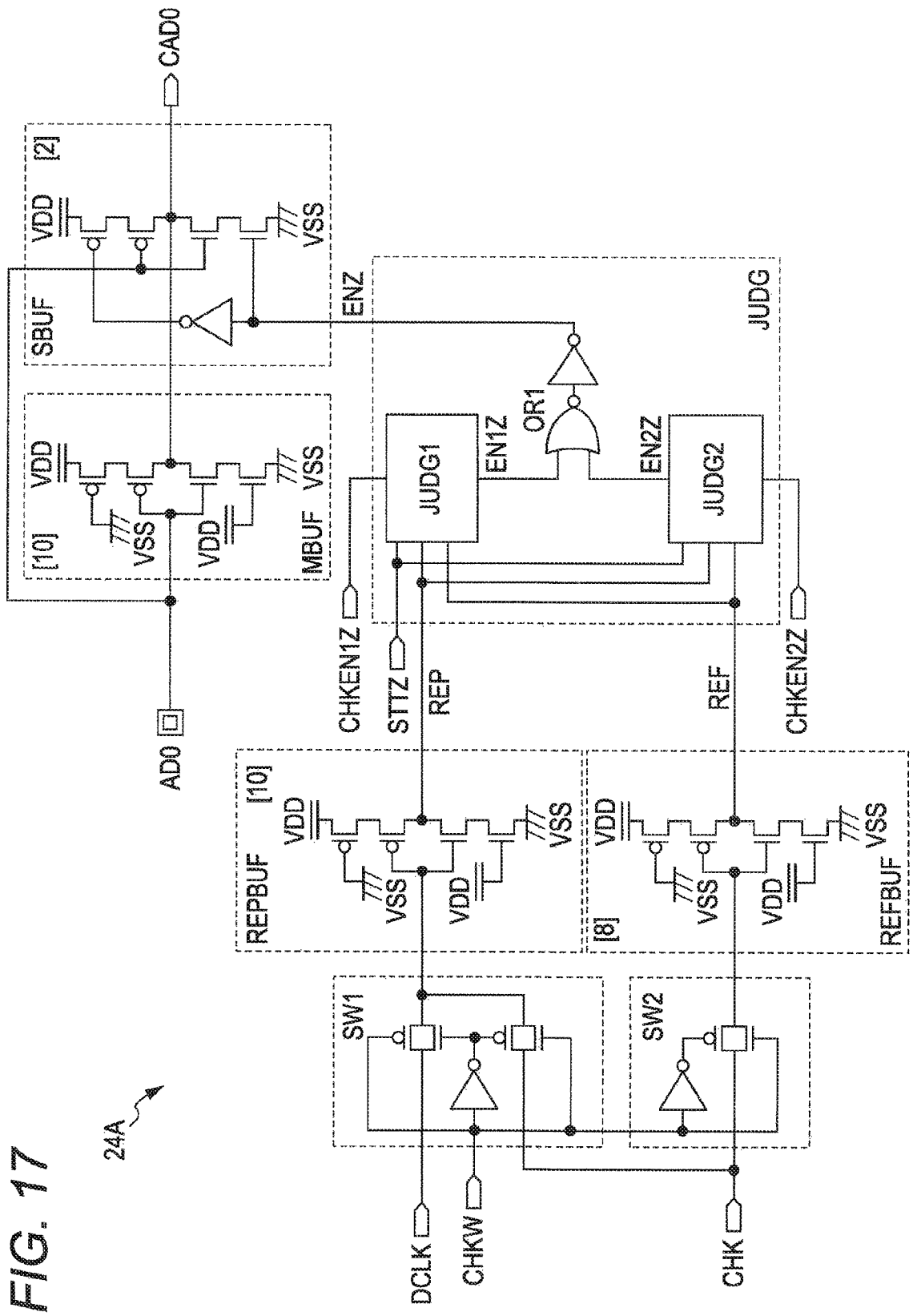
FIG. 17 shows aspects of another exemplary address buffer circuit.

FIG. 17 shows another example of the address buffer circuit shown in FIG. 16. In the address buffer circuit 24A in FIG. 17, one CMOS transmission gate of the switch circuit SW1 receives the frequency-divided clock signal DCLK. The other configuration shown in FIG. 17 is the same as that in FIG. 6. In FIG. 17, the replica buffer circuit REPBUF, while the check signal CHKW is at low-level, receives the frequency-divided clock signal DCLK and gradually deteriorates.

The frequency of supplying the frequency-divided clock signal DCLK to the replica buffer circuit REPBUF is set higher than the worst frequency of supplying the address signal AD to the main buffer circuit MBUF, which is the highest frequency of supplying the address signal AD. Because the deterioration speed of the replica buffer circuit REPBUF is set equal to or faster than the deterioration speed of all main buffer circuits MBUF. The division ratio of the divider 36A is designed such that deterioration speed of the replica buffer circuit REPBUF becomes equal to or faster than the deterioration speed of all the main buffer circuits MBUF. The divider 36A generates the replica input signal with a frequency higher than the frequency of supplying the address signal AD.

The fourth embodiment has the same effect as those in the aforesaid embodiments. In the fourth embodiment, the frequency of generating the frequency-divided clock signal DCLK is set higher than the frequency of supplying the address signal AD, whereby the deterioration of the electrical characteristic of the main buffer circuit MBUF is more surely detected. The switch circuits SW1 and SW2, the replica buffer circuit REPBUF, the reference buffer circuit REFBUF, and the determination circuit JUDG may be provided so as to be common to the plural buffer sections corresponding to the plural address terminals AD, whereby the chip size of the memory MEM may be reduced.

Figure 18:
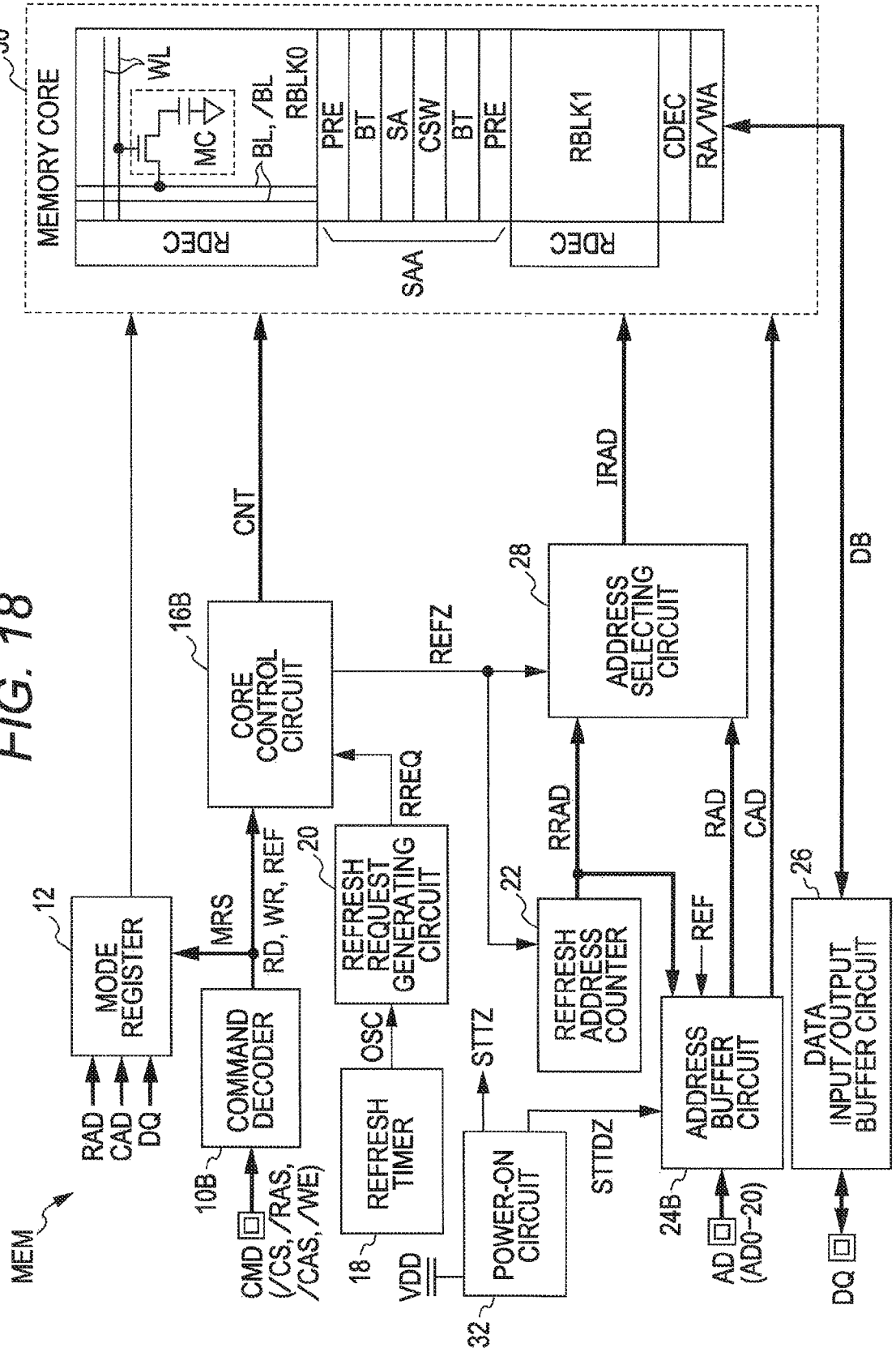
FIG. 18 shows aspects of a fifth embodiment.

FIG. 18 shows a fifth embodiment. In the fifth embodiment, the same elements as those in the above-mentioned embodiments are denoted by the same numerals, and the explanation thereof are omitted. In the fifth embodiment, the semiconductor integrated circuit may be a semiconductor memory MEM (DRAM). The semiconductor memory MEM shown in FIG. 18 includes a command decoder 10B, a core control circuit 16B and an address buffer circuit 24B instead of the command decoder 10, the core control circuit 16 and the address buffer circuit 24 shown in FIG. 3. The remaining configuration in FIG. 18 is the same as that in FIG. 3.

The command decoder 10B outputs the command recognized according to the logic level of the command signal CMD (chip selecting signal/CS, row address strobe signal/RAS, column address strobe signal/CAS, and write enable signal/WE) as a read command RD and a write command WR for accessing to the memory core 30, a refresh command REF for performing a refresh operation to the memory core 30, or a mode register setting command MRS for setting the mode register 12, or the like.

The core control circuit 16B does not have the arbiter 14, different from the core control circuit 16 in FIG. 3. In the DRAM, the refresh command REF is supplied from the outside of the memory MEM during the normal operation mode for receiving the read command RD or the like. Therefore, the arbiter 14, which detects the conflict between the read command RD or the write command WR and the refresh command REF, is unnecessary. The refresh timer 18 and the refresh request generating circuit 20 are operated only during the self-refresh mode in which the external command such as the read command RD or the like is not supplied. The refresh address counter 22 counts up in synchronism with the falling edge of the refresh signal REFZ, not the refresh request signal RREQ.

In the DRAM, the row address signal RAD and the column address signal CAD are supplied to the common address terminal AD in a time-sharing manner (address multiplex method). The address buffer circuit 24B includes a selector that identifies the address signal AD received at the address terminal AD as the row address signal RAD or the column address signal CAD according to the row address strobe signal/RAS and the column address strobe signal/CAS. The remaining configuration of the address buffer circuit 24B is the same as that of the address buffer circuit 24 shown in FIG. 3.

Figure 19:
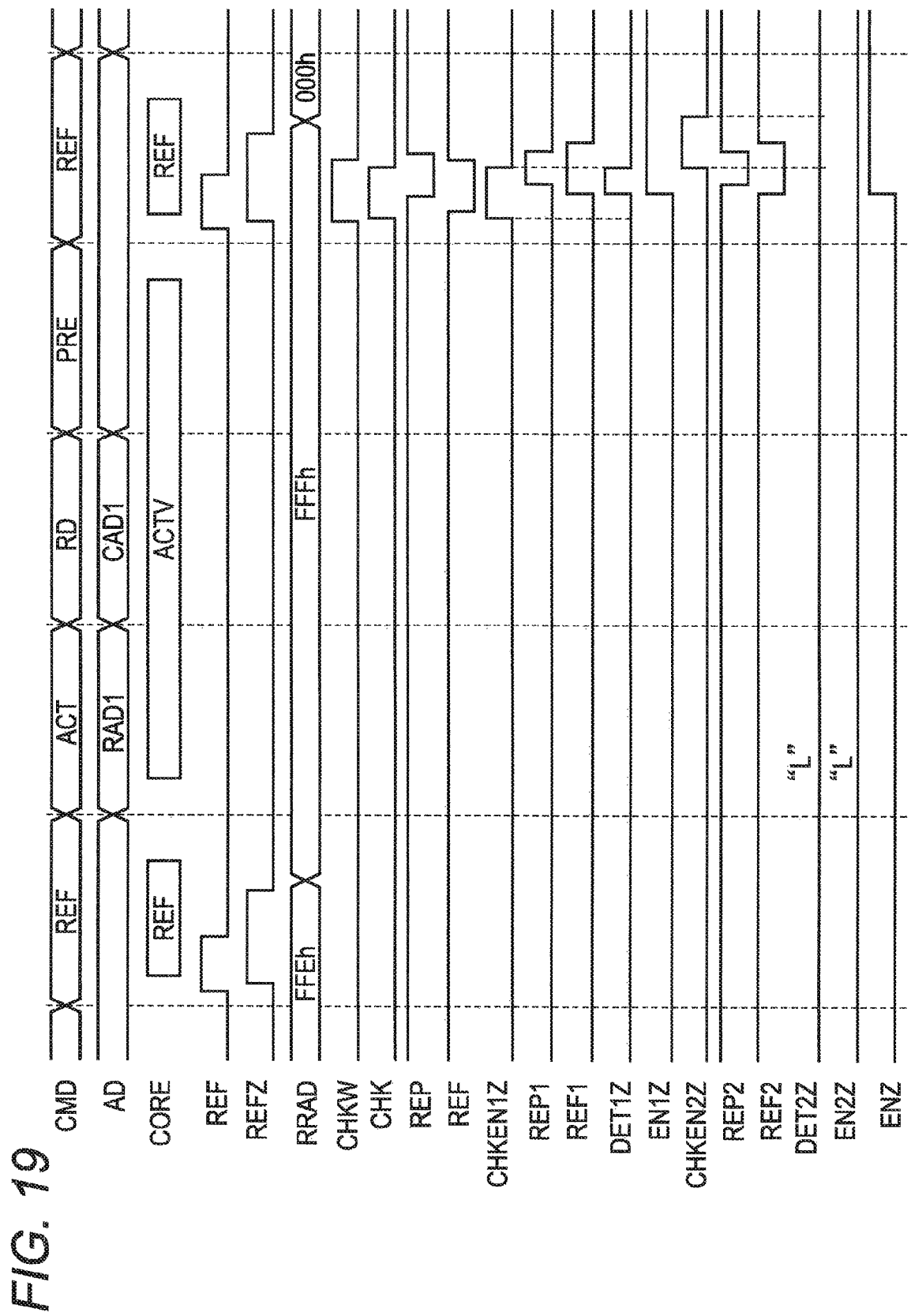
FIG. 19 shows aspects of an exemplary access operation of a memory.

FIG. 19 shows one example of the access operation of the memory MEM shown in FIG. 18. FIG. 19 shows the operation when the nMOS transistor of the main buffer circuit MBUF of the address buffer circuit 24B is deteriorated. The RAD1 and CAD1 of the address terminal AD respectively indicate the row address signal RAD and the column address signal CAD. The ACTV of the memory core CORE indicates the active operation period in which the word line WL is activated.

In FIG. 19, the memory MEM sequentially receives the refresh command REF, an active command ACT, the read command RD, a precharge command PRE and the refresh command REF to operate. The interval of supplying the command is, for example, 100 ns. The operation of detecting the deterioration of the address buffer circuit 24B is the same as the detecting operation shown in FIG. 11.

The fifth embodiment has the same effect as the effect in the above-mentioned embodiments. In the DRAM in the fifth embodiment, the reduction in the driving capability of the address buffer circuit 24F is also prevented.

Figure 20:
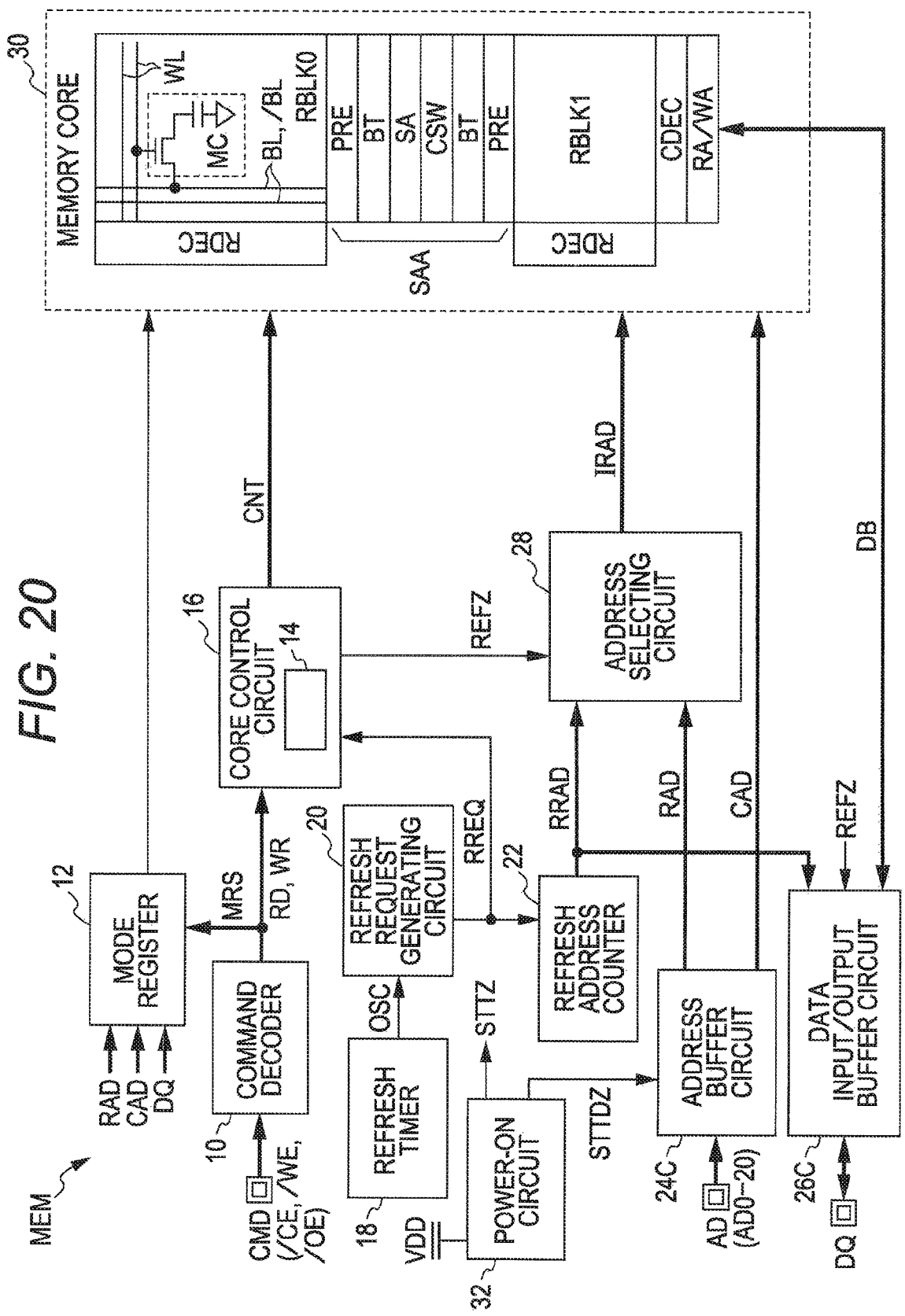
FIG. 20 shows aspects of a sixth embodiment.

FIG. 20 shows a sixth embodiment. In the sixth embodiment, the same elements as those in the above-mentioned embodiments are denoted by the same numerals, and the explanation thereof are omitted. In the sixth embodiment, the semiconductor integrated circuit may be a semiconductor memory MEM (FCRAM). The semiconductor memory MEM includes an address buffer circuit 24C and a data input/output buffer circuit 26C, instead of the address buffer circuit 24 and the data input/output buffer circuit 26 shown in FIG. 3. The remaining configuration of the sixth embodiment is the same as that shown in FIG. 3.

The address buffer circuit 24C is an input buffer circuit including only the main buffer circuit MBUF for every address terminal AD. The data input/output buffer circuit 26C includes, in addition to the function of the data input/output buffer circuit and the data output buffer circuit shown in FIG. 3, a function of automatically increasing the driving capability, when the driving capability of the data output buffer circuit (the main buffer circuit MBUF in FIG. 21) outputting the data signal DQ has deteriorated.

Figure 21:
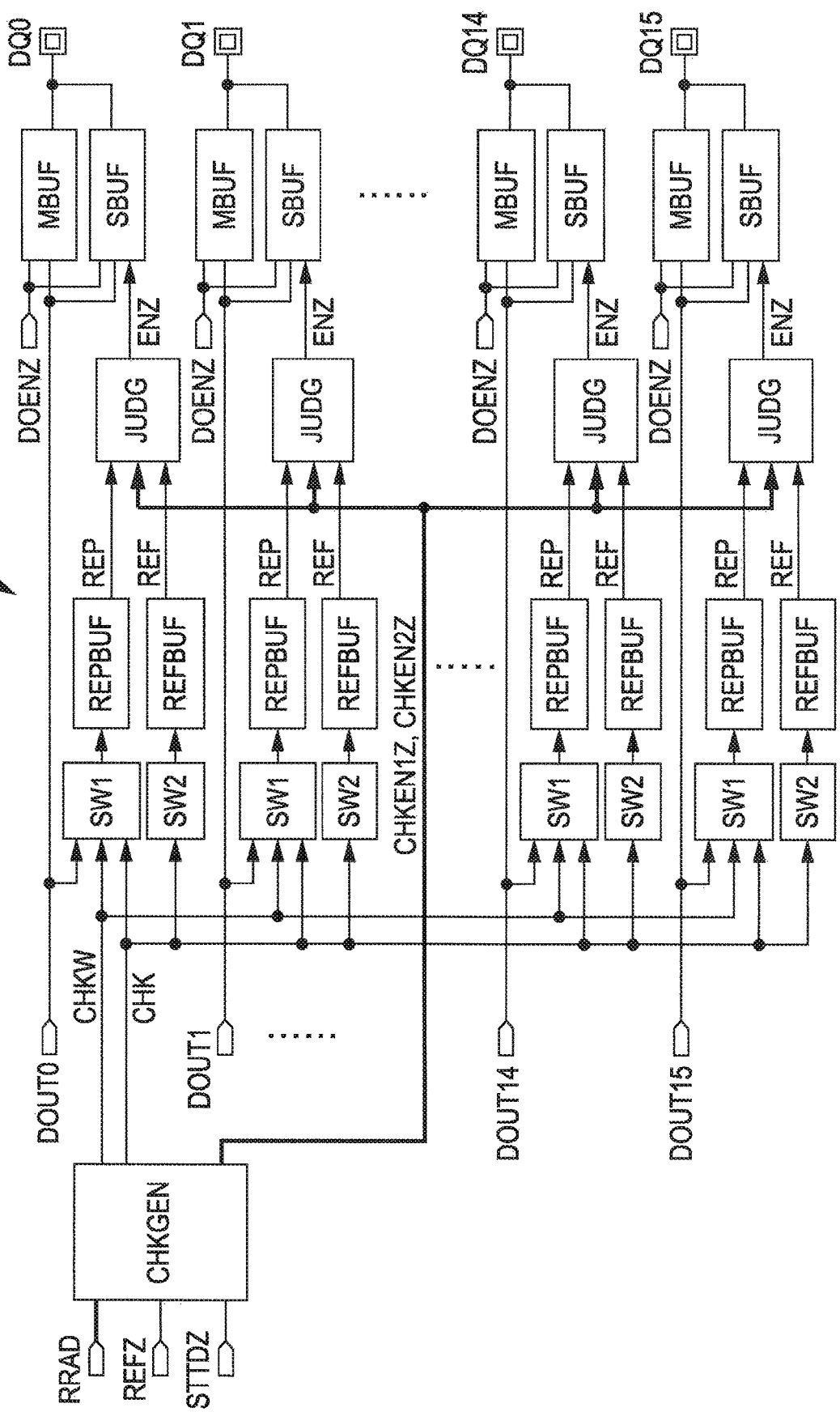
FIG. 21 shows aspects of an exemplary data output buffer circuit.

FIG. 21 shows the data output buffer circuit in the data input/output buffer circuit 26C shown in FIG. 20. The data output buffer circuit includes the check signal generating circuit CHKGEN that is common to the data terminals DQ0-DQ15, the switch circuits SW1 and SW2 corresponding to each of the data terminals DQ0-DQ15, the replica buffer circuit REPBUF, the reference buffer circuit REFBUF, the determination circuit JUDG, the main buffer circuit MBUF, and the sub-buffer circuit SBUF. The check signal generating circuit CHKGEN, the switch circuits SW1 and SW2, and the determination circuit JUDG are the same as those shown in FIGS. 4 to 6.

The switch circuit SW1 transmits the data signal DOUT0, which is read from the memory core 30 via the data bus DB, to the replica buffer circuit REPBUF when the check signal CHKW is at low-level (during the normal state). The switch circuit SW1 transmits the check signal CHK to the replica buffer circuit REPBUF when the check signal CHKW is at high-level (during the check state).

The operations of the switch circuit SW2, the replica buffer circuit REPBUF, the reference buffer circuit REFBUF, and the determination circuit JUDG are the same as those of the circuits shown in FIG. 4. The main buffer circuit MBUF receives the data signal DOUT0 during the activation of a data output enable terminal DOENZ, and outputs the received signal as the data signal DQ0. The data output enable terminal DOENZ is generated by the core control circuit 16 shown in FIG. 20 upon the reading operation. The sub-buffer circuit SBUF operates during the activation of the data output enable terminal DOENZ and the enable signal ENZ, receives the data signal DOUT0, and outputs the received signal as the data signal DQ0.

Figure 22:
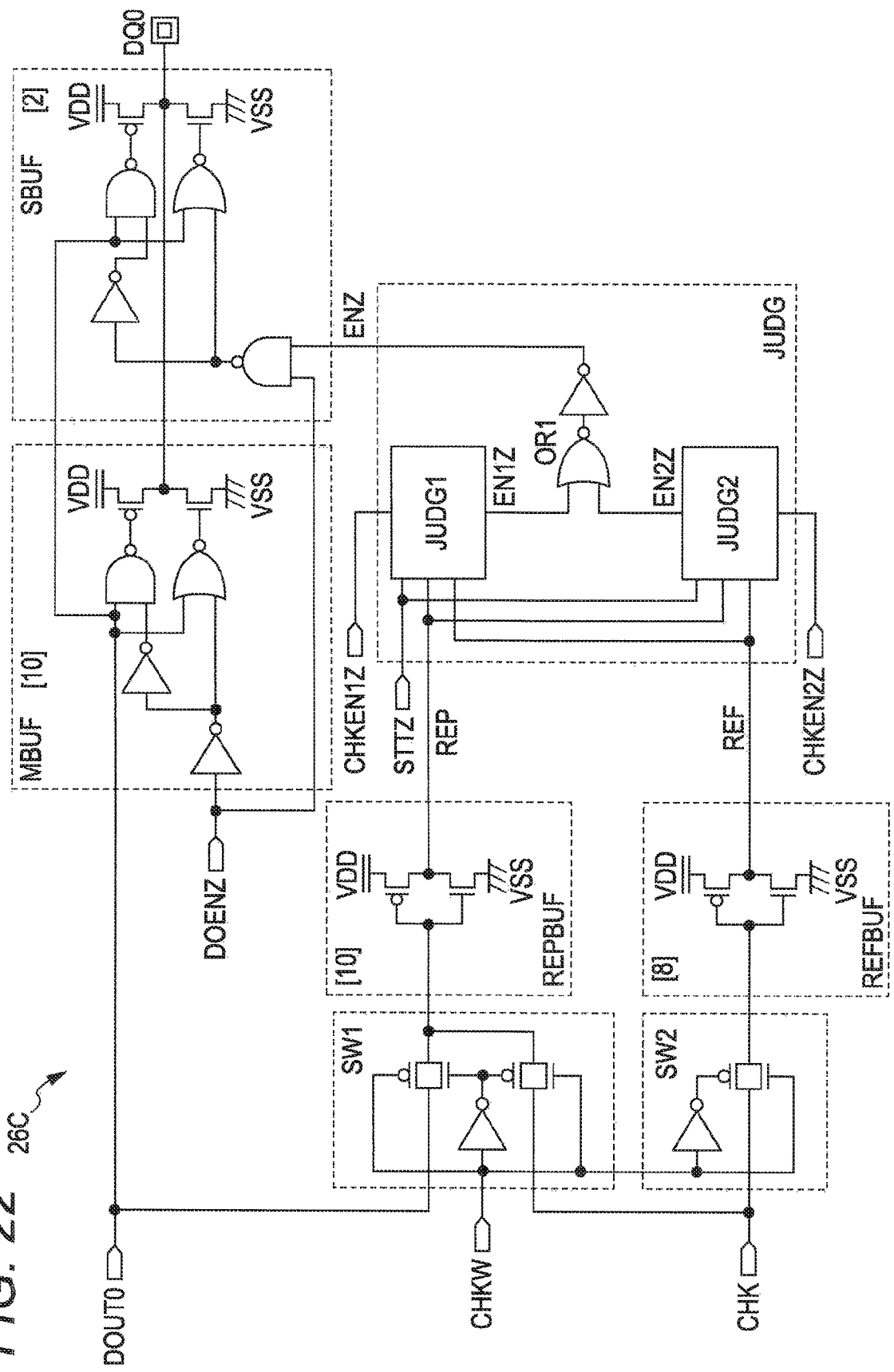
FIG. 22 shows aspects of an exemplary switch circuit, an exemplary buffer circuit, and an exemplary determination circuit.

FIG. 22 shows one example of the switch circuits SW1 and SW2, the buffer circuits MBUF, SBUF, REPBUF, and REFBUF, and the determination circuit JUDG, corresponding to the data signal DQ0 shown in FIG. 21. The configurations of the switch circuits SW1 and SW2, the buffer circuits MBUF, SBUF, REPBUF, and REFBUF, and the determination circuit JUDG, corresponding to the other data signals DQ1-DQ15 are the same as those shown in FIG. 22. The numerical values in the parentheses in the buffer circuits MBUF, SBUF, REPBUF, and REFBUF indicate the relative values of the driving capabilities of the buffer circuits MBUF, SBUF, REPBUF, and REFBUF. A circuit different from the circuit shown in the FIG. 6 will be described.

The main buffer circuit MBUF is a tri-state output buffer. The pMOS transistor and the nMOS transistor in the output buffer are respectively controlled by a NAND gate and NOR gate that become effective during the activation of the output enable terminal DOENZ. The source of the pMOS transistor is coupled to the power supply line VDD. For example, the power supply voltage VDD supplied from the outside of the memory MEM is supplied to the power supply line VDD. The source of the nMOS transistor is coupled to the ground line VSS. In the sub-buffer circuit SBUF, the NAND gate and the NOR gate become effective during the activation of the output enable terminal DOENZ and the enable signal ENZ. The size of the pMOS transistor and the nMOS transistor in the sub-buffer circuit SBUF is smaller than the size of the pMOS transistor and the nMOS transistor in the main buffer circuit MBUF. The remaining configuration of the sub-buffer circuit SBUF is the same as that of the main buffer circuit MBUF.

The replica buffer circuit REPBUF includes a CMOS inverter having a pMOS transistor and an nMOS transistor which have the same size as those in the main buffer circuit MBUF. The reference buffer circuit REFBUF includes a CMOS inverter having a pMOS transistor and an nMOS transistor which has the size smaller than those in the main buffer circuit MBUF. The deterioration of the replica buffer circuit REPBUF (main buffer circuit MBUF) is determined in the same manner as in the operation shown in FIGS. 10 to 13.

The sixth embodiment has the effect same as the effect of the aforesaid embodiments. In the sixth embodiment, the sub-buffer circuit SBUF is operated when the deterioration of the main buffer circuit MBUF of the data output buffer circuit in the data input/output buffer circuit 26C is detected, whereby the reduction in the driving capability of the data output buffer circuit is prevented.

Figure 23:
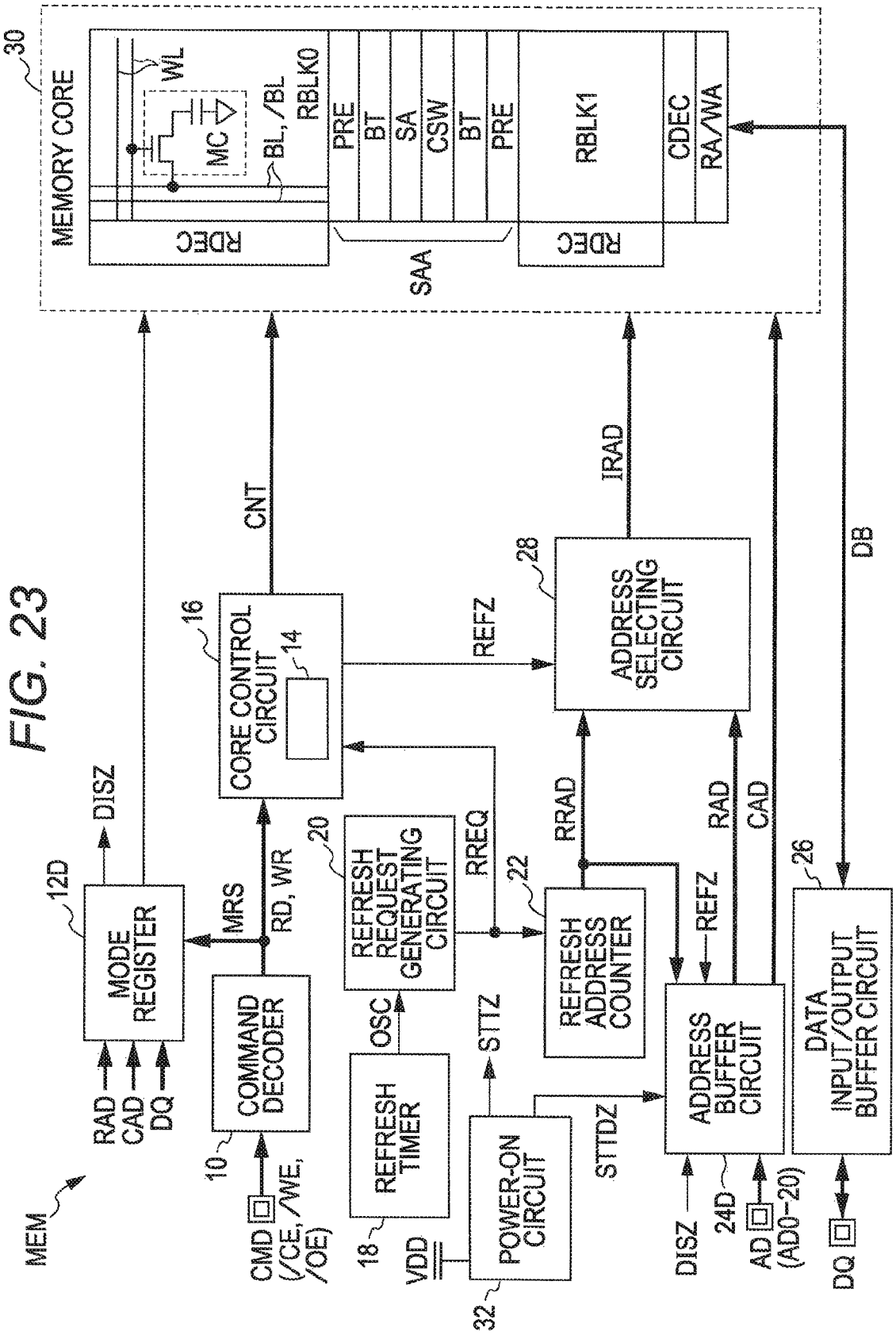
FIG. 23 shows aspects of a seventh embodiment.

FIG. 23 shows a seventh embodiment. The same elements in the seventh embodiment as those in the above-mentioned embodiments are denoted by the same numerals, and the explanation thereof are omitted. In the seventh embodiment, the semiconductor integrated circuit may be a semiconductor memory MEM (FCRM). The semiconductor memory MEM shown in FIG. 23 includes a mode register 12D and an address buffer circuit 24D instead of the mode register 12 and the address buffer circuit 24 in FIG. 3. The remaining configuration shown in FIG. 23 is the same as the other configuration in FIG. 3.

The mode register 12D outputs an inhibition signal DISZ according to at least any one of the row address signal RAD, the column address signal CAD and the data signal DQ, which are received in synchronism with the mode register setting command MRS. The other function of the mode register 12D is the same as the other function of the mode register 12 in FIG. 3. The address buffer circuit 24D includes a function of stopping the determination of the deterioration made by the determination circuit JUDG during the activation of the inhibition signal DISZ. The remaining function of the address buffer circuit 24D is the same as the function of the address buffer circuit 24 shown in FIG. 4.

Figure 24:
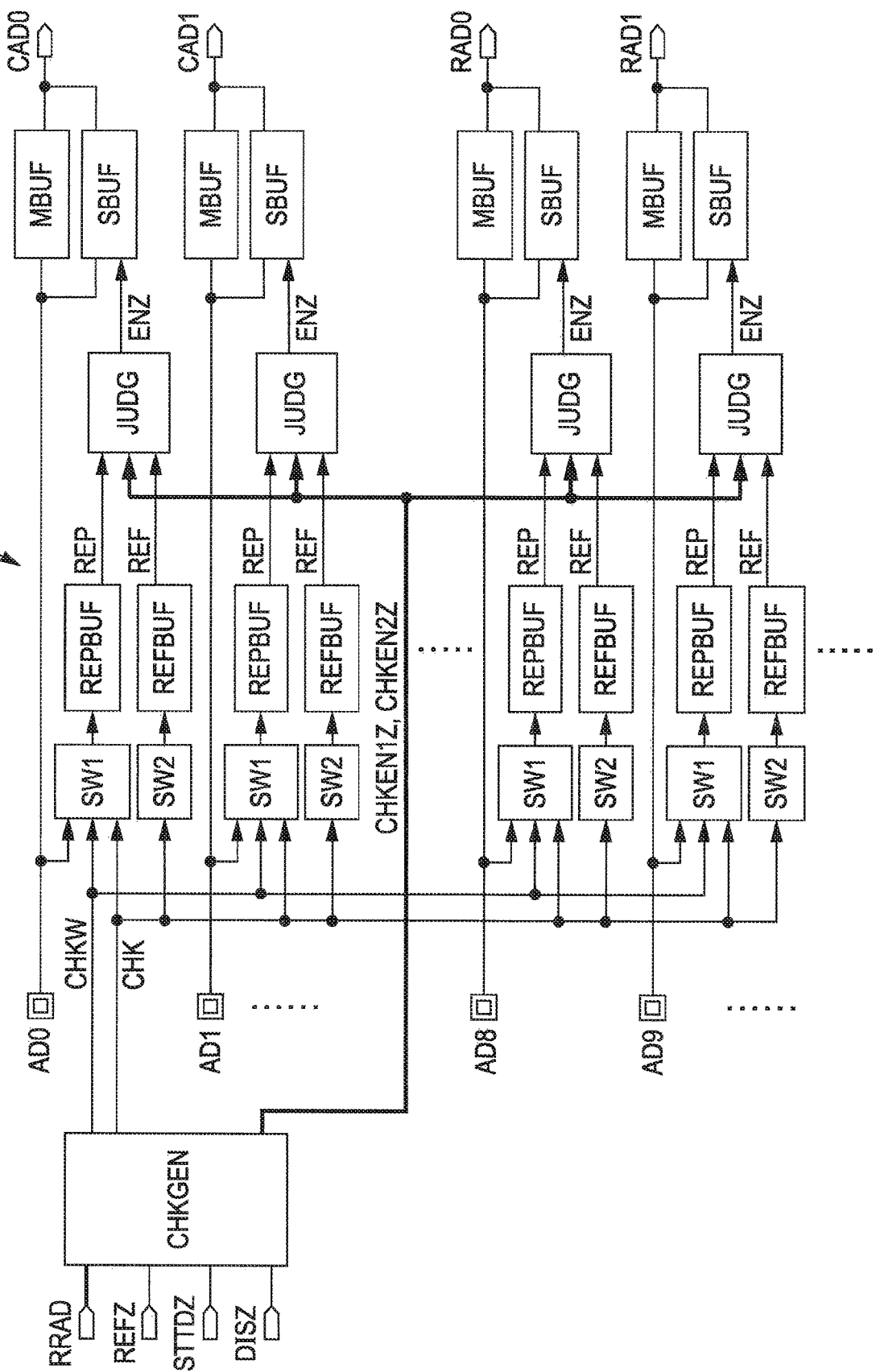
FIG. 24 shows aspects of an exemplary address buffer circuit.

FIG. 24 shows one example of the address buffer circuit 24D shown in FIG. 23. The check signal generating circuit CHKGEN of the address buffer circuit 24D is different from the check signal generating circuit CHKGEN shown in FIG. 4. The remaining configuration shown in FIG. 24 is the same as the configuration of the address buffer circuit 24 shown in FIG. 4. The check signal generating circuit CHKGEN does not activate the check signals CHK and CHKW and the check enable signals CHKEN1Z and CHKEN2Z during the activation of the inhibition signal DISZ. The operation of the check signal generating circuit CHKGEN during the deactivation of the inhibition signal DISZ is the same as the operation shown in FIGS. 10 to 13.

Figure 25:
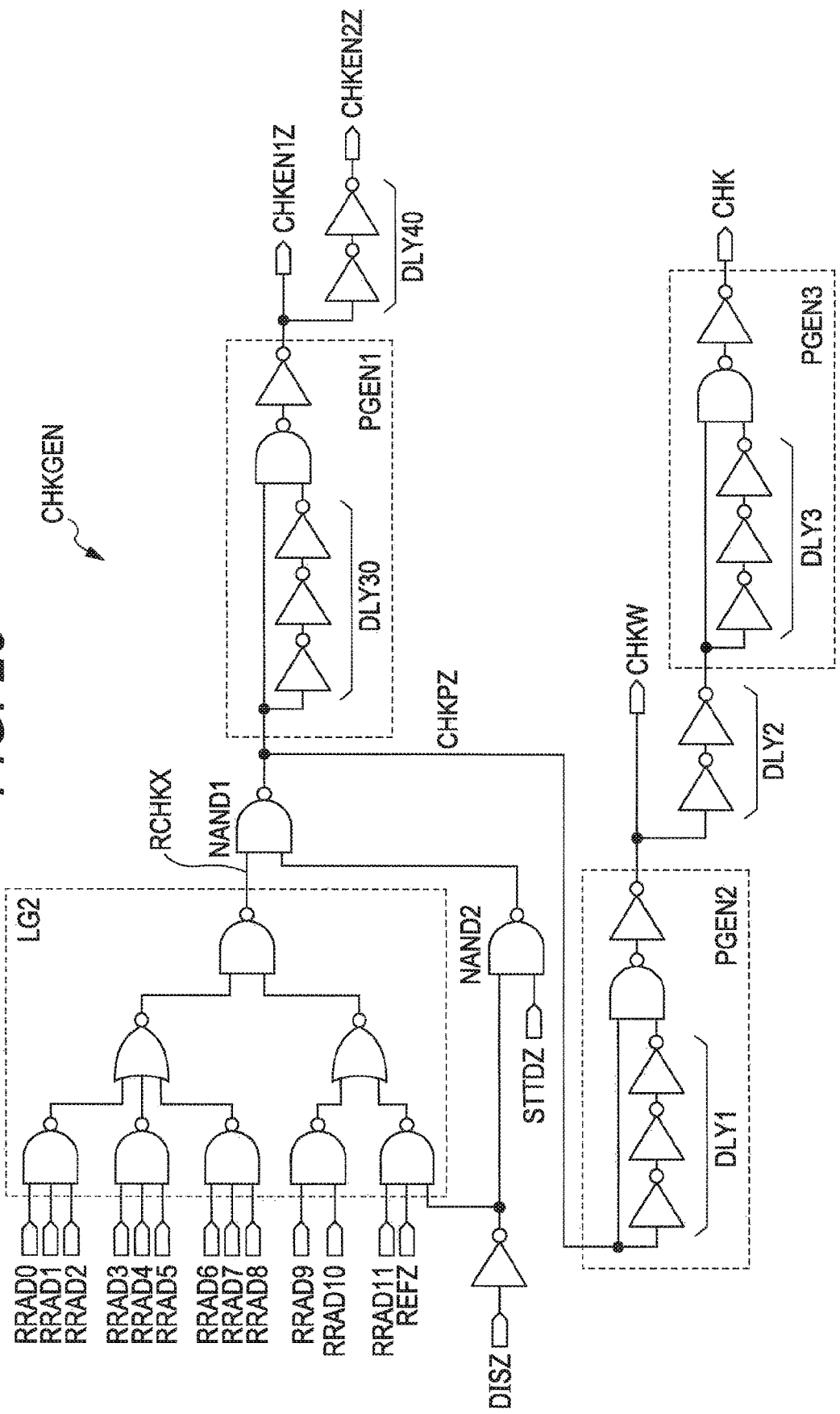
FIG. 25 shows aspects of an exemplary check signal generating circuit.

FIG. 25 shows one example of the check signal generating circuit CHKGEN shown in FIG. 24. The logic circuit LG2 in the check signal generating circuit CHKGEN shown in FIG. 25 is different from the logic circuit LG1 in the check signal generating circuit CHKGEN shown in FIG. 5. In the logic circuit LG2, the logic of the inhibition signal DISZ is added in order to inhibit the activation of a check signal RCHKX. The check signal generating circuit CHKGEN shown in FIG. 24 includes a NAND gate NAND2 that receives the signal obtained by inversing the logic of the inhibition signal DISZ and the starter signal STTDZ. The remaining configuration of the check signal generating circuit CHKGEN shown in FIG. 24 is the same as the other configuration shown in FIG. 5.

The check signal generating circuit CHKGEN fixes a check pulse signal CHKPZ to a low level during the activation of the inhibition signal DISZ. The check signal generating circuit CHKGEN inhibits the generation of the check signals CHK and CHW and the check enable signals CHKEN1Z and CHKEN2Z during the activation of the inhibition signal DISZ. The determination operation by the determination circuit JUDG may be stopped by supplying the inhibition signal DISZ to the determination circuit JUDG during the activation of the inhibition signal DISZ. The output of the enable signal ENZ from the determination circuit JUDG may be inhibited.

The seventh embodiment has the same effect as the effect of the aforesaid embodiments. Since the function of inhibiting the determination of the determination circuit JUDG is provided in the seventh embodiment, the power consumption of the memory MEM is reduced. For example, in the system using the low power supply voltage VDD (e.g., 2 V), the deterioration of the transistor due to hot carriers or the like is difficult to occur. In the system described above, the inhibition signal DISZ is activated so as to reduce the power consumption when the mode register 12D is initialized upon the power-on. The inhibition signal DISZ is activated in the test process of the memory MEM, whereby the stand-by current of the memory core 30, for example, is correctly measured.

Figure 26:
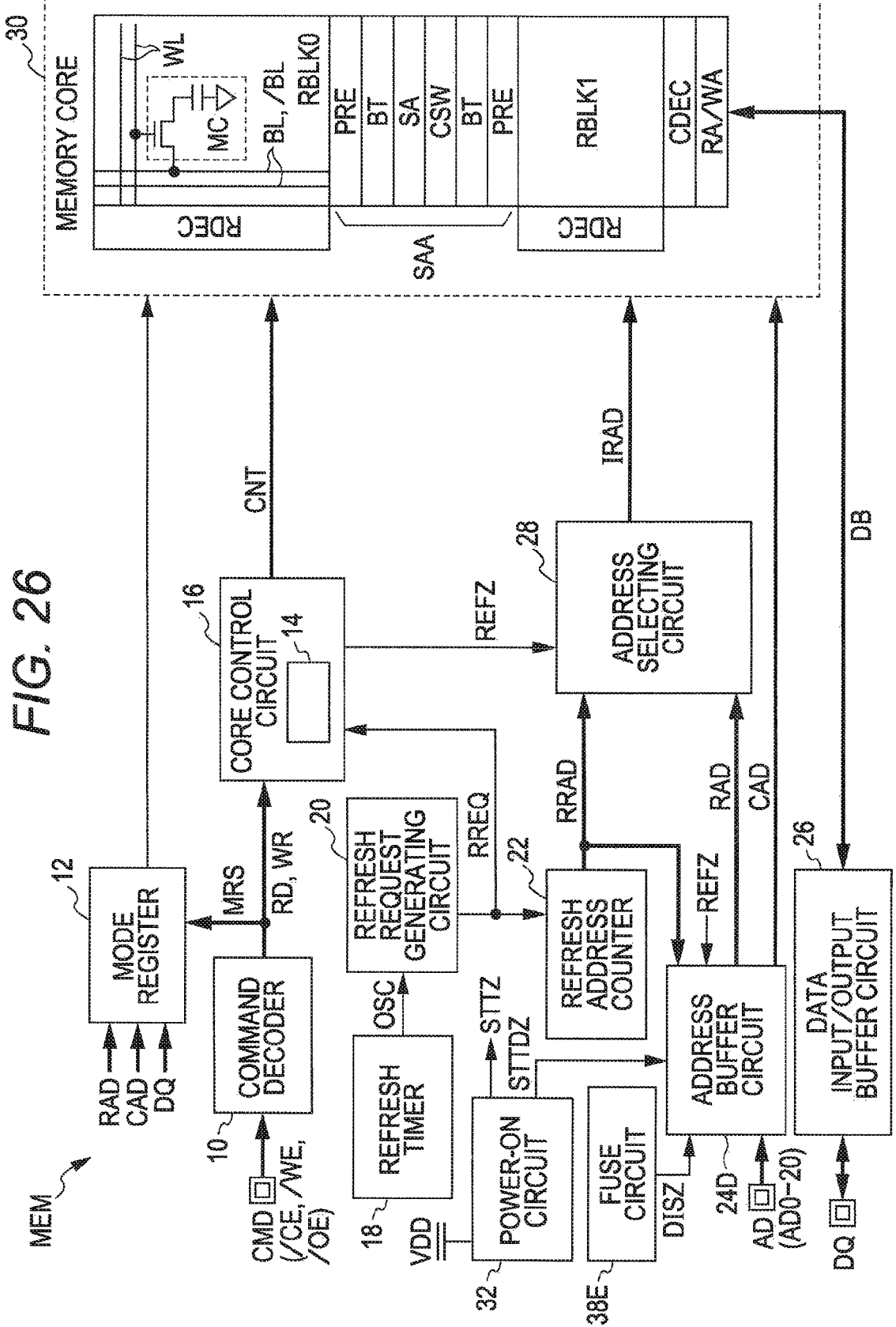
FIG. 26 shows aspects of an eighth embodiment.

FIG. 26 shows an eighth embodiment. The same elements as those in the above-mentioned embodiments are denoted by the same numerals, and the explanation thereof are omitted. The semiconductor integrated circuit in the eighth embodiment may be a semiconductor memory MEM (FCRAM). The semiconductor memory MEM includes an address buffer circuit 24D instead of the address buffer circuit 24 shown in FIG. 3. The memory MEM includes a fuse circuit 38E. The remaining configuration shown in FIG. 26 is the same as the other configuration in FIG. 3.

The address buffer circuit 24D shown in FIG. 26 is the same as the address buffer circuit shown in FIG. 24. The fuse circuit 38E activates the inhibition signal DISZ when the incorporated fuse is programmed. In the eighth embodiment, the inhibition signal DISZ is activated by the fuse circuit 38E, not by the mode register 12D.

The eighth embodiment has the same effect as the effect of the aforesaid embodiment. In the eighth embodiment, the fuse circuit 38E is programmed in the test process of the memory MEM, whereby the memory MEM, in which the determination function of the determination circuit JUDG is made ineffective, is shipped. For example, the determination function of the determination circuit JUDG in the memory MEM having a specification in which the power supply voltage VDD is low (e.g., 2 V) may be made ineffective in the test process before the memory MEM is shipped. The mode register 12 shown in FIG. 26 may be replaced by the mode register 12D shown in FIG. 23 so as to make the determination function of the determination circuit JUDG ineffective according to the inhibition signal DISZ output from the fuse circuit 38E or the mode register 12D. In this case, the inhibition signal DISZ from the fuse circuit 38E takes priority.

Figure 27:
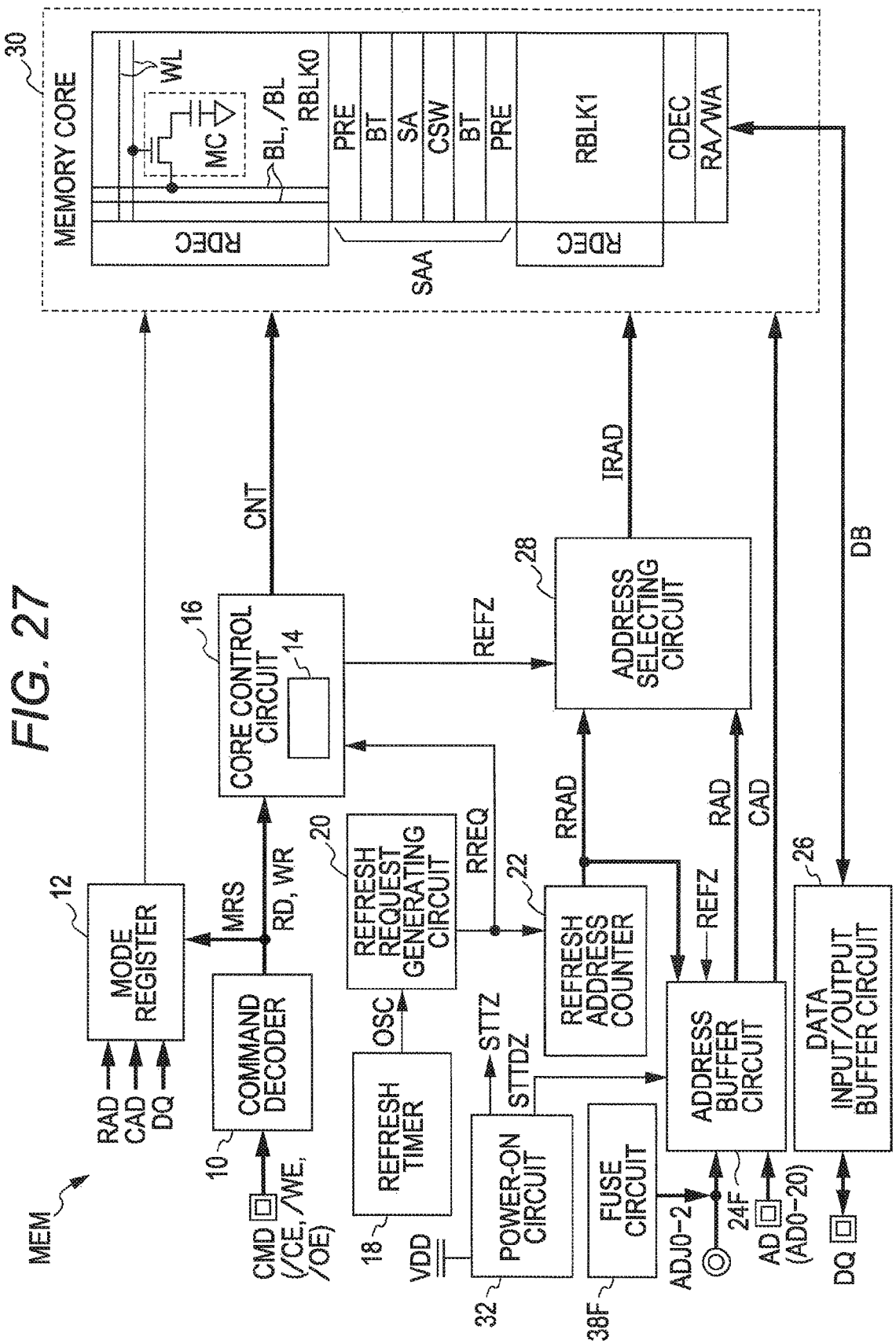
FIG. 27 shows aspects of a ninth embodiment.

FIG. 27 shows a ninth embodiment. The same elements as those in the above-mentioned embodiments are denoted by the same numerals, and the explanation thereof are omitted. The semiconductor integrated circuit in the ninth embodiment may be a semiconductor memory MEM (FCRAM). The semiconductor memory MEM includes an address buffer circuit 24F instead of the address buffer circuit 24 shown in FIG. 3. The memory MEM includes a fuse circuit 38F and an adjusting pad for receiving adjusting signals ADJ0-2. The adjusting signal ADJ0-2 is supplied to the address buffer circuit 24F. The remaining configuration shown in FIG. 27 is the same as the configuration shown in FIG. 3.

The fuse circuit 38F is a non-volatile program circuit that changes the logic of the output adjusting signals ADJ0-2 according to the program state (stored adjusting value) of the incorporated fuse. The fuse circuit 38F outputs the adjusting signals ADJ0-2 whose logics are all at low level when it is not programmed. The adjusting signals ADJ0-2 also may be supplied from the outside of the memory MEM via the adjusting pad. Since the current flowing through the signal line of the adjusting signals ADJ0-2 from the fuse circuit 38F is small, the adjusting signals ADJ0-2 given to the adjusting pad may temporarily make the set value of the fuse circuit 38F ineffective.

Figure 28:
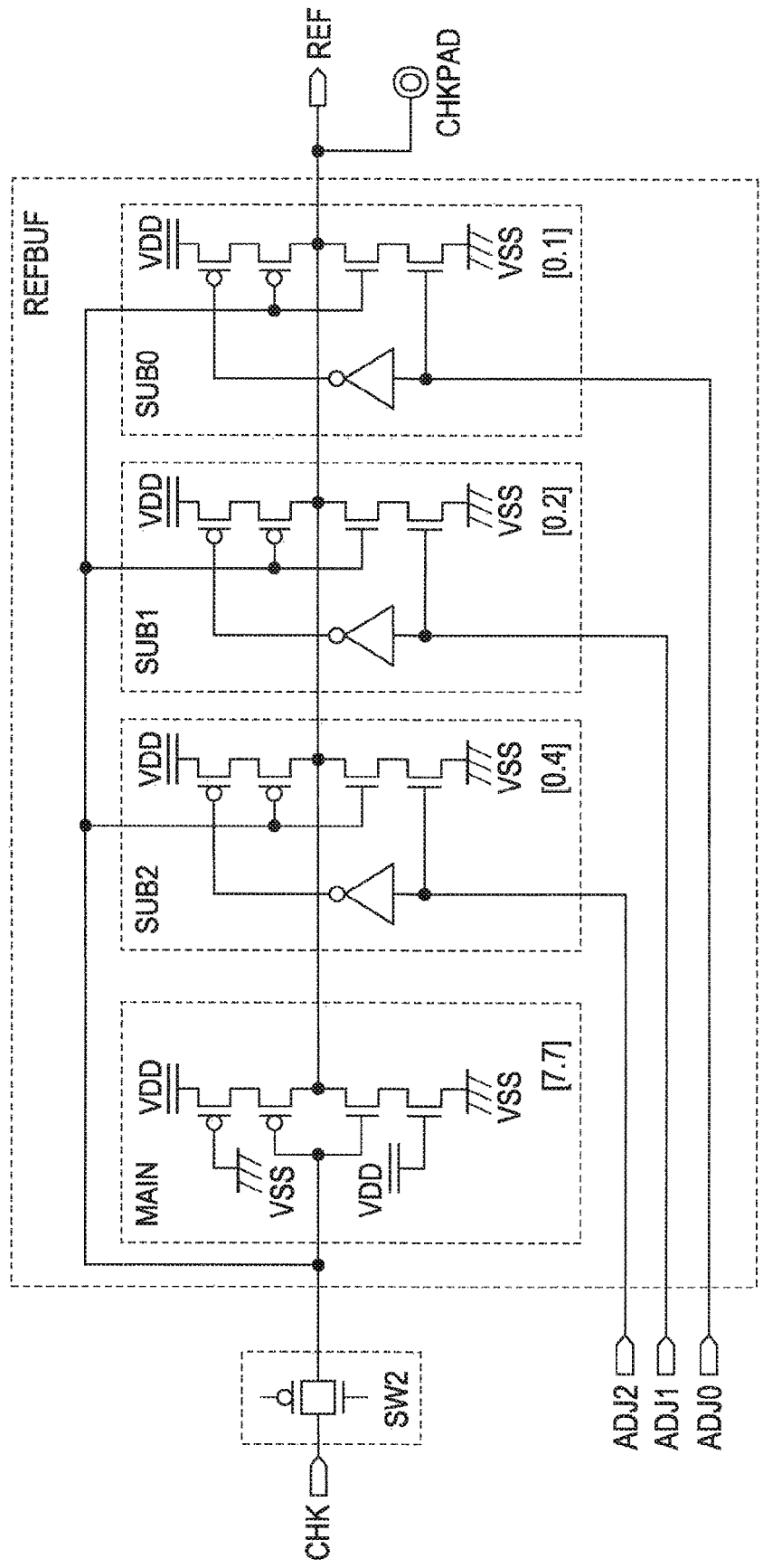
FIG. 28 shows aspects of an exemplary address buffer circuit.

FIG. 28 shows one example of the address buffer circuit 24F shown in FIG. 27. FIG. 28 shows the reference buffer circuit REFBUF in the address buffer circuit 24F shown in FIG. 27. The configurations of the switch circuit SW2, unillustrated switch circuit SW1, the replica buffer circuit REPBUF, the determination circuit JUDG, the main buffer circuit MBUF, and the sub-buffer circuit SBUF are the same as those in FIG. 6.

The reference buffer circuit REFBUF includes a main buffer MAIN and three sub-buffer circuits SUB0-SUB2. The numerical values in parentheses indicate the relative values of the driving capabilities of the main buffer MAIN and the sub-buffers SUB0-SUB2. The configuration of the main buffer MAIN is the same as the configuration of the reference buffer circuit REFBUF shown in FIG. 6, except that the main buffer MAIN has a low driving capability. In the sub-buffers SUB0-SUB2, the pMOS transistor and nMOS transistor close to the power supply line VDD or VSS are controlled by the adjusting signals ADF0-2. The driving capabilities of the sub-buffers SUB0-SUB2 are different from the driving capability of the main buffer MAIN. The other configurations of the sub-buffers SUB0-SUB2 are the same as the other configuration of the main buffer MAIN.

The sub-buffer SUB0 becomes effective when the adjusting signal ADJ0 is at high-level, receives the check signal CHK, and outputs the reference output signal REF. The sub-buffer SUB1 becomes effective when the adjusting signal ADJ1 is at high-level, receives the check signal CHK, and outputs the reference output signal REF. The sub-buffer SUB2 becomes effective when the adjusting signal ADJ2 is at high-level, receives the check signal CHK, and outputs the reference output signal REF. The driving capability of the reference buffer circuit REFBUF is adjusted into eight patterns (from 7.7 to 8.4 in increments of 0.1) based on the sub-buffers SUB0-SUB2. The output current of the reference buffer circuit REFBUF is measured from a check pad CHK-PAD.

In the ninth embodiment, the driving capability of the reference buffer circuit REFBUF is adjusted by using the test system shown in FIG. 9. The LSI tester TEST measures the output current (High-level output current IOH, Low-level output current IOH) of the main buffer circuit MBUF shown in FIG. 6. The replica buffer circuit REPBUF includes a transistor having the same size as those of the main buffer circuit MBUF. The output current of the replica buffer circuit REPBUF is equal to the output current of the main buffer circuit MBUF.

The LSI tester TEST measures the output current of the reference buffer circuit REFBUF as sequentially changing the voltage of the adjusting pads ADJ0-2. The LSI tester TEST obtains the logic values of the adjusting signals ADJ0-2 when the output current becomes 80% of the output current of the main buffer circuit MBUF, for example. The LSI tester TEST programs the fuse circuit 38F to the value corresponding to the logic of the obtained adjusting signals ADJ0-2. The fuse of the fuse circuit 38F is programmed by a laser device or the like. The ratio of the output current of the reference buffer circuit REFBUF to the replica buffer circuit REPBUF is set to be 80%.

The ninth embodiment has the same effect as the effect of the aforesaid embodiments. In the ninth embodiment, the ratio of the output currents of the replica buffer circuit REPBUF and the reference buffer circuit REFBUF is finely adjusted. According to this fine adjustment, the determination circuit JUDG may correctly determine the deterioration of the main buffer circuit MBUF in the address buffer circuit 24F.

Figure 29:
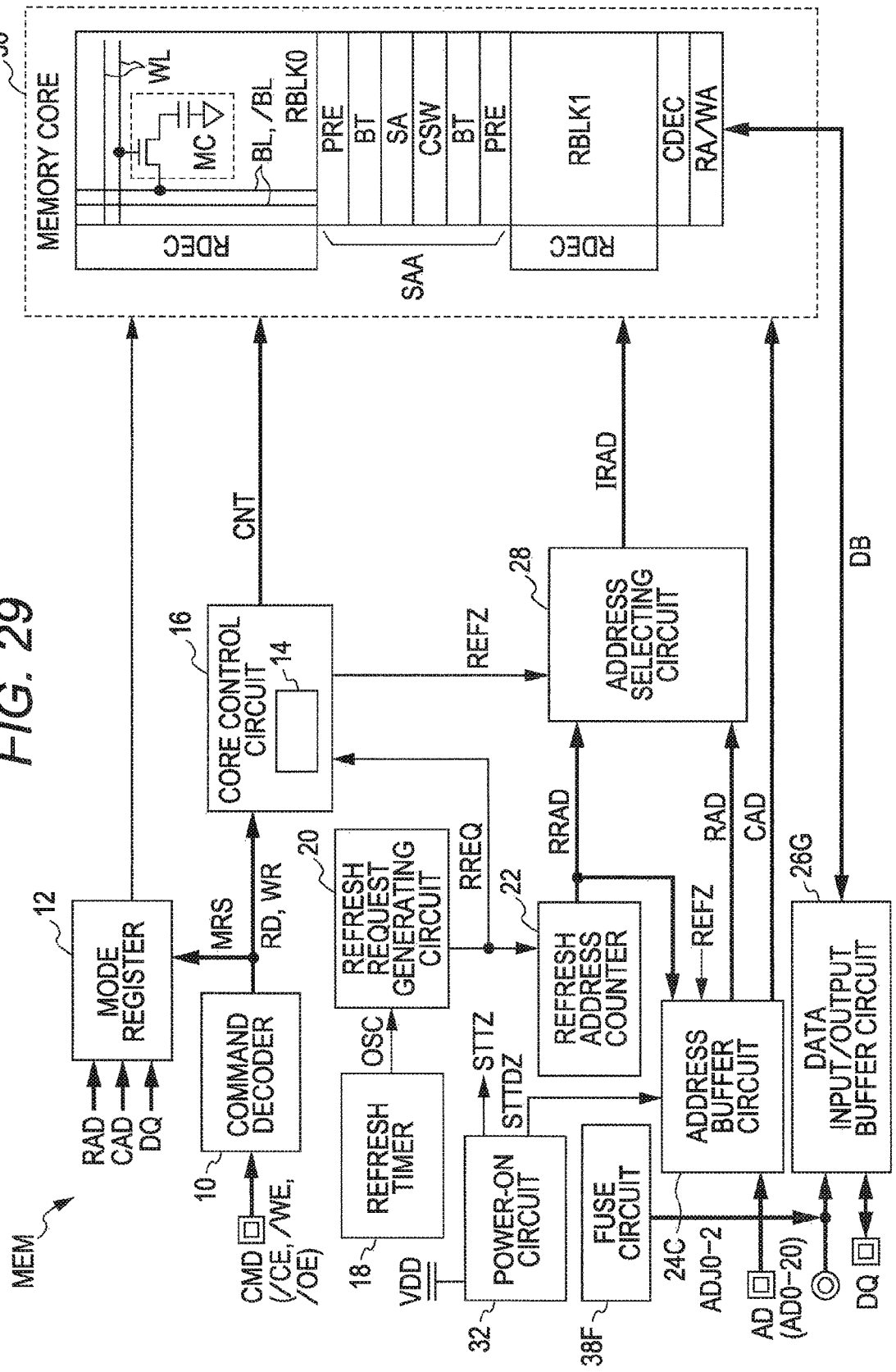
FIG. 29 shows aspects of a tenth embodiment.

FIG. 29 shows a tenth embodiment. In the tenth embodiment, the same elements as those in the above-mentioned embodiments are denoted by the same numerals, and the explanation thereof are omitted. The semiconductor integrated circuit in the tenth embodiment may be a semiconductor memory MEM (FCRAM). The semiconductor memory MEM includes an address buffer circuit 24C and a data input/output buffer circuit 26G instead of the address buffer circuit 24 and the data input/output buffer circuit 26 shown in FIG. 3. The address buffer circuit 24C is the same as the address buffer circuit in FIG. 20. The memory MEM has a fuse circuit 38F and adjusting pads for receiving the adjusting signals ADJ0-2. The fuse circuit 38F is the same as the fuse circuit shown in FIG. 27. The adjusting signals ADJ0-2 are supplied to the data input/output buffer circuit 26G. The remaining configuration in FIG. 29 is the same as the configuration in FIG. 3.

Figure 30:
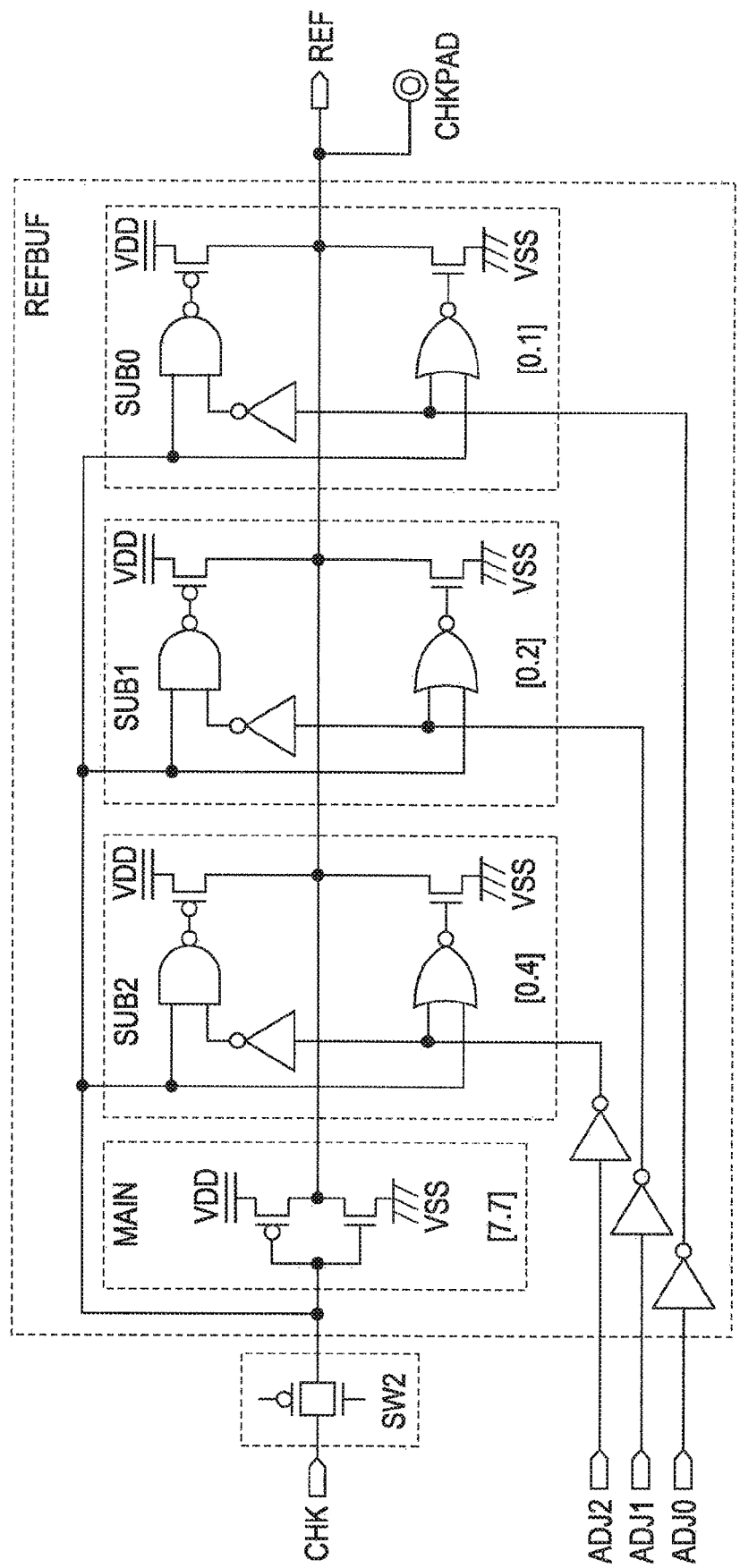
FIG. 30 shows aspects of an exemplary data input/output buffer circuit.

FIG. 30 shows one example of the data input/output buffer circuit 26G shown in FIG. 29. FIG. 30 shows the reference buffer circuit REFBUF in the data input/output buffer circuit 26G. The configurations of the switch circuit SW2, unillustrated switch circuit SW1, the replica buffer circuit REPBUF, the determination circuit JUDG, the main buffer circuit MBUF, and the sub-buffer circuit SBUF are the same as the configuration shown in FIG. 22.

The reference buffer circuit REFBUF includes a main buffer MAIN and three sub-buffers SUB0-SUB2. The numerical values in parentheses indicate the relative values of the driving capabilities of the main buffer MAIN and the sub-buffers SUB0-SUB2. The main buffer MAIN includes a driving capability lower than that of the reference buffer circuit REFBUF shown in FIG. 22. The remaining configuration of the main buffer MAIN is the same as the configuration of the reference buffer circuit REFBUF shown in FIG. 22. The sub-buffers SUB0-SUB2 are tri-state output buffers that become effective by the high-level adjusting signals ADJ0-2.

The sub-buffer SUB0 becomes effective when the adjusting signal ADJ0 is at high-level, receives the check signal CHK, and outputs the reference output signal REF. The sub-buffer SUB1 becomes effective when the adjusting signal ADJ1 is at high-level, receives the check signal CHK, and outputs the reference output signal REF. The sub-buffer SUB2 becomes effective when the adjusting signal ADJ2 is at high-level, receives the check signal CHK, and outputs the reference output signal REF. The driving capability of the reference buffer circuit REFBUF is adjusted into eight patterns (from 7.7 to 8.4 in increments of 0.1) based on the sub-buffers SUB0-SUB2. The output current of the reference buffer circuit REFBUF is measured from a check pad CHKPAD. In the tenth embodiment, the driving capability of the reference buffer circuit REFBUF is adjusted using the test system shown in FIG. 9 as explained in FIG. 28.

The tenth embodiment has the same effect as the effect of the aforesaid embodiments. In the tenth embodiment, the ratio of the output currents of the replica buffer circuit REPBUF and the reference buffer circuit REFBUF is finely adjusted. According to this fine adjustment, the determination circuit JUDG may correctly determine the deterioration of the main buffer circuit MBUF in the data input/output buffer circuit 26G.

Figure 31:
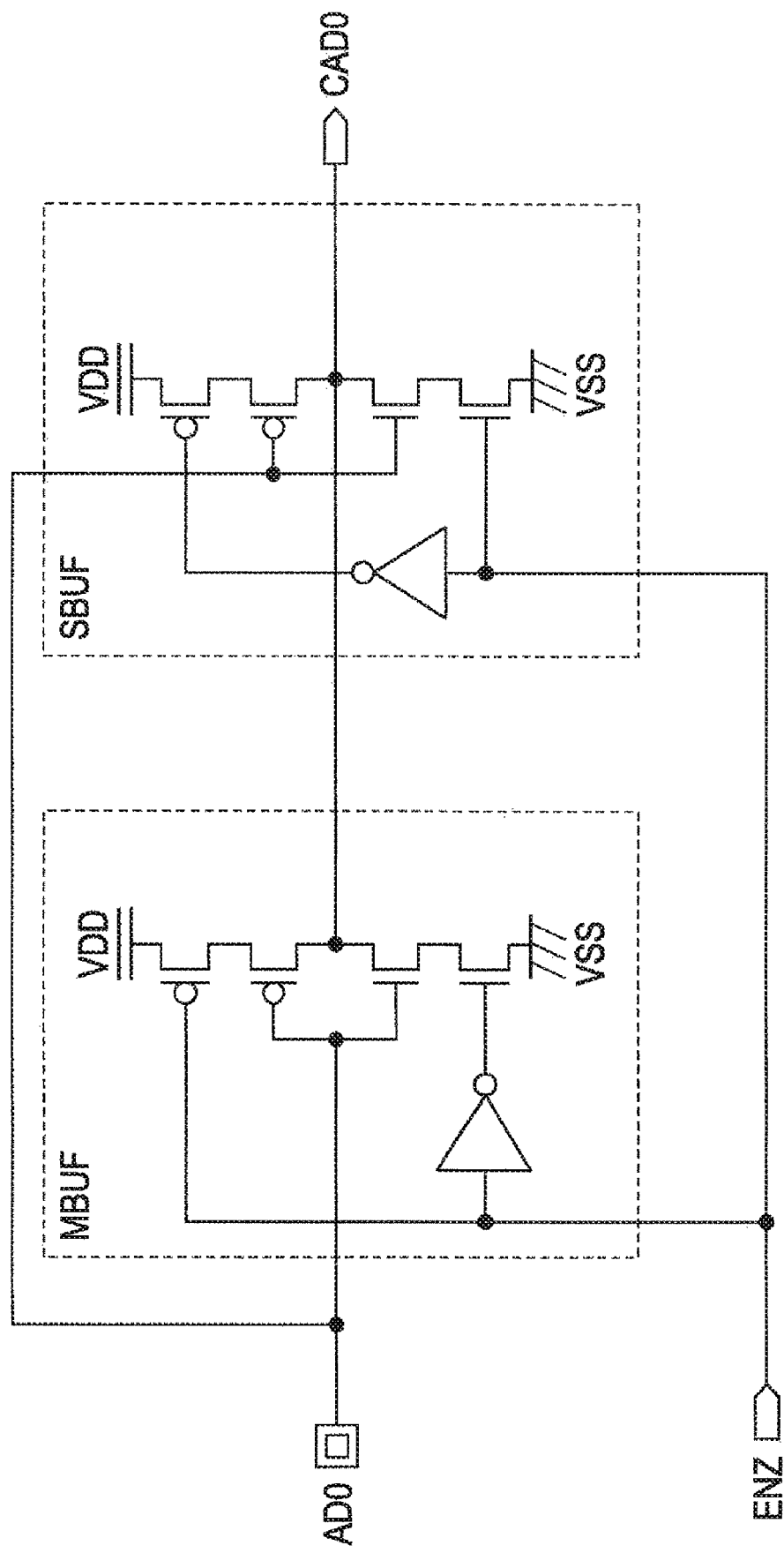
FIG. 31 shows aspects of an exemplary address buffer circuit.

In the aforesaid embodiment, the sub-buffer circuit SBUF is added when the main buffer circuit MBUF in the address buffer circuit is deteriorated. However, as shown in FIG. 31, the operation of the main buffer circuit MBUF may be inhibited by the addition of the logic of the enable signal ENZ to the main buffer circuit MBUF when the man buffer MBUF has deteriorated. Specifically, when the main buffer circuit MBUF has deteriorated, the main buffer circuit MBUF may be replaced by the sub-buffer circuit SBUF. The pMOS transistor and the nMOS transistor respectively coupled to the power supply lines VDD and VSS of the main buffer circuit MBUF inhibit the output of the address signal CAD0 during the activation of the enable signal ENZ.

Figure 32:
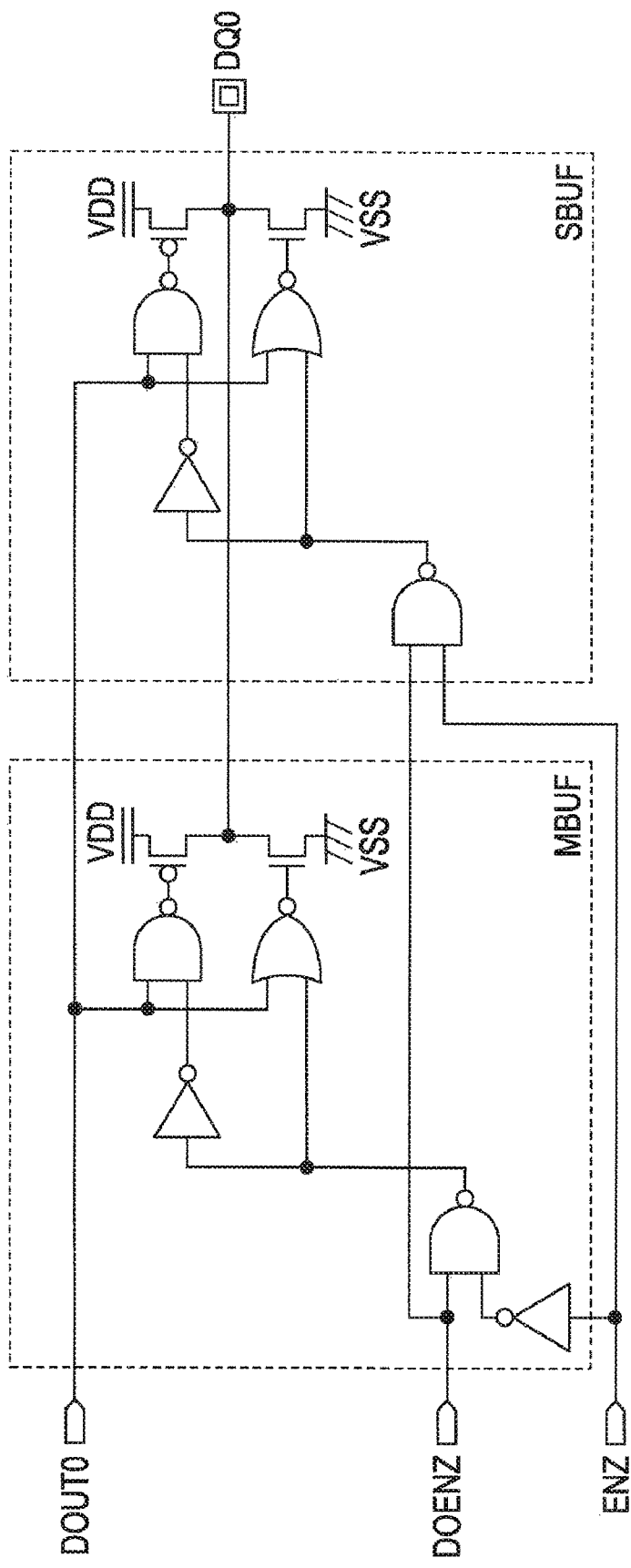
FIG. 32 shows aspects of an exemplary data input/output buffer circuit.

As shown in FIG. 32, the logic of the enable signal ENZ is added to the main buffer circuit MBUF of the data input/output buffer circuit, and the operation of the main buffer circuit MBUF may be inhibited when the main buffer circuit MBUF has deteriorated. Specifically, when the main buffer circuit MBUF has deteriorated, the main buffer circuit MBUF may be replaced by the sub-buffer circuit SBUF. The pMOS transistor and the nMOS transistor respectively coupled to the power supply lines VDD and VSS of the main buffer circuit MBUF inhibit the output of the data signal DQ0 during the activation of the enable signal ENZ.

The embodiments shown in FIGS. 15, 20, 23, 26, 27 and 29 are applied to the FCRAM. However, these embodiments may be applied to the DRAM. The applied semiconductor memory may be a clock asynchronous type or a clock synchronous type. These embodiments are applied to a logic LSI such as a gate array or microcomputer.

The embodiments described above are applied to any one of the address buffer circuit and the data output/input buffer circuit. However, the above-mentioned embodiments may be applied to both of the address buffer circuit and the data output/input buffer circuit. The above-mentioned embodiments also may be applied to the data input buffer circuit, command input buffer circuit, or the like. When the condition of the manufacturing process of a transistor is the same, i.e., when the transistor structure is the same, the check signal generating circuit CHKGEN, the switch circuits SW1 and SW2, the replica buffer circuit REPBUF, the reference buffer circuit REFBUF, and the determination circuit JUDG are used in common in the address buffer circuit and the data output buffer circuit.

In the embodiment shown in FIG. 3, the check signals CHK and CHKW are generated when the refresh address signal RRAD goes back to the start and upon the power-on. However, the check signals CHK and CHKW may be generated using an exclusive timer, or may be generated in synchronism with an external refresh command or an exclusive external command. When a semiconductor integrated circuit is mounted on a system in which power is not turned off after power is turned on, the circuit for generating the check signals CHK and CHKW upon the power-on is unnecessary. When a semiconductor integrated circuit is mounted on a system in which power-on and power-off are frequently repeated, the check signals CHK and CHKW may be synchronously generated only upon the power-on.

Aspects of the present invention have now been described in accordance with the above advantages. It will be appreciated that these examples are merely illustrative of the invention. Many variations and modifications will be apparent to those skilled in the art.

The invention claimed is:

1. A semiconductor integrated circuit comprising:
   an output terminal;
   a first buffer circuit that outputs a first output signal to the output terminal on receipt of a first input signal;
   a second buffer circuit that includes a circuit having a substantially identical configuration as the first buffer circuit, outputs a second output signal on receipt of the first input signal, and outputs the second output signal based on a check signal;
   a third buffer circuit that outputs a third output signal based on the check signal;
   a determination circuit that receives the second output signal and the third output signal, and activates a detection signal in response to the detection that the second output signal is behind the third output signal; and
   a fourth buffer circuit that operates during the activation of the detection signal, and outputs the third output signal to the output terminal on receipt of the first input signal.

2. The semiconductor integrated circuit according to claim 1, wherein the second buffer circuit receives the first input signal as the second input signal.

3. The semiconductor integrated circuit according to claim 1, further comprising:

an inhibition circuit that inhibits the supply of the first input signal to the second buffer circuit when the check signal is supplied.

4. The semiconductor integrated circuit according to claim 1, further comprising:
a cycle circuit that generates the second input signal with a frequency higher than the frequency of supplying the first input signal.

5. The semiconductor integrated circuit according to claim 4, wherein the cycle circuit includes a clock generating circuit that generates the second input signal according to an external clock signal.

6. The semiconductor integrated circuit according to claim 1, further comprising:
a check signal generating circuit that generates the check signal with a predetermined cycle.

7. The semiconductor integrated circuit according to claim 6, further comprising:
a dynamic memory cell; and
a refresh request circuit that periodically generates a refresh request signal for refreshing the dynamic memory cell,
wherein the check signal generating circuit generates the check signal based on the refresh request signal.

8. The semiconductor integrated circuit according to claim 1, further comprising:
a power-on circuit that receives a power supply voltage and activates a starter signal when the power supply voltage exceeds a first voltage; and
a check signal generating circuit that generates the check signal in response to the activation of the starter signal.

9. The semiconductor integrated circuit according to claim 7, wherein the check signal generating circuit includes a mask circuit that inhibits the generation of the check signal when an inhibition signal is supplied.

10. The semiconductor integrated circuit according to claim 1, wherein the determination circuit includes an edge determination circuit that compares a timing of a transition edge of the second output signal and a timing of a transition edge of the third output signal, and outputs the detection signal according to the result of the comparison.

11. The semiconductor integrated circuit according to claim 10, wherein the determination circuit includes a waveform dulling circuit that makes the transition edge of the second output signal and the transition edge of the third output signal dull, wherein the edge determination circuit compares the timing of the transition edge of the second output signal and the timing of the transition edge of the third output signal.

12. The semiconductor integrated circuit according to claim 11, wherein the edge determination circuit includes:
a rising edge determination circuit that compares the timing of the rising edge of the second output signal and the timing of the rising edge of the third output signal so as to output the detection signal according to the result of the comparison; and
a falling edge determination circuit that compares the timing of the falling edge of the second output signal and the timing of the falling edge of the third output signal so as to output the detection signal according to the result of the comparison.

13. The semiconductor integrated circuit according to claim 1, wherein a driving capability of the third buffer circuit is smaller than a driving capability of the second buffer circuit.

14. The semiconductor integrated circuit according to claim 13, further comprising:

a non-volatile program circuit that outputs an adjusting signal according to a stored adjusting value to the third buffer circuit,
wherein the third buffer circuit includes a plurality of fourth buffer circuits that are turned on or off according to the logic value of an adjusting signal from the outside or the adjusting signal from the program circuit.

15. The semiconductor integrated circuit according to claim 1, wherein the first buffer circuit includes a mask circuit which inhibits the output of the first output signal during the activation of the detection signal.

16. The semiconductor integrated circuit according to claim 1, further comprising:
a plurality of memory cells,
wherein the first buffer circuit includes an address buffer circuit that receives an address signal supplied from the outside for selecting the memory cell.

17. The semiconductor integrated circuit according to claim 1, further comprising:
a memory cell,
wherein the first buffer circuit includes a data output buffer circuit that outputs the data read from the memory cell.

18. A semiconductor integrated circuit comprising:
a first output terminal;
a second output terminal;
a first buffer section that includes a first buffer circuit which outputs a first output signal to the first output terminal on receipt of a first input signal, and a second buffer circuit which receives the first input signal;
a second buffer section that includes a third buffer circuit which outputs a second output signal to the second output terminal on receipt of a second input signal, and a fourth buffer circuit which receives the second input signal;
a fifth buffer circuit that includes a circuit having a substantially identical configuration as the first buffer circuit and the third buffer circuit, outputs a third output signal on receipt of a third input signal, and outputs the third output signal based on a check signal;
a sixth buffer circuit that outputs a fourth output signal based on the check signal; and
a determination circuit that receives the third output signal and the fourth output signal, and activates a detection signal in response to the detection that the third output signal is behind the fourth output signal,
wherein the second buffer circuit operates during the activation of the detection signal, and outputs a fifth output signal to the first output terminal on receipt of the first input signal, and
the fourth buffer circuit operates during the activation of the detection signal, and outputs a sixth output signal to the second output terminal on receipt of the second input signal.

19. A system comprising:
a semiconductor integrated circuit; and
a controller that accesses the semiconductor integrated circuit,
wherein the semiconductor integrated circuit includes:
an output terminal;
a first buffer circuit that outputs a first output signal to the output terminal on receipt of a first input signal;
a second buffer circuit that includes a circuit having a substantially identical configuration as the first buffer circuit, outputs a second output signal on receipt of the first input signal, and outputs the second output signal based on a check signal;

a third buffer circuit that outputs a third output signal based on the check signal;

a determination circuit that receives the second output signal and the third output signal, and activates a detection signal in response to a detection that the second output signal is behind the third output signal; and a fourth buffer circuit that operates during the activation of the detection signal, and outputs the third output signal to the output terminal on receipt of the first input signal.

20. The system according to claim 19, wherein the semiconductor integrated circuit includes a semiconductor memory, and wherein the controller supplies an access request to the semiconductor memory.

* * * * *